United States Patent
Namba et al.

(10) Patent No.: US 8,594,608 B2
(45) Date of Patent: Nov. 26, 2013

(54) SYNTHESIZER AND RECEPTION DEVICE

(75) Inventors: Akihiko Namba, Osaka (JP); Yasunobu Tsukio, Osaka (JP)

(73) Assignee: Panasonic Corporation, Osaka (JP)

( * ) Notice: Subject to any disclaimer, the term of this patent is extended or adjusted under 35 U.S.C. 154(b) by 423 days.

(21) Appl. No.: 12/922,734

(22) PCT Filed: Mar. 17, 2009

(86) PCT No.: PCT/JP2009/001166
§ 371 (c)(1),
(2), (4) Date: Sep. 15, 2010

(87) PCT Pub. No.: WO2009/116262
PCT Pub. Date: Sep. 24, 2009

(65) Prior Publication Data
US 2011/0009083 A1    Jan. 13, 2011

(30) Foreign Application Priority Data
Mar. 18, 2008  (JP) .................. 2008-069032

(51) Int. Cl.
*H04B 1/26* (2006.01)
(52) U.S. Cl.
USPC ............... 455/318; 455/75; 455/76; 455/139; 455/164.1; 455/182.2; 455/192.2; 455/258; 375/344; 348/735; 331/175; 331/176
(58) Field of Classification Search
USPC ............... 455/318, 75, 76, 139, 164.1, 182.2, 455/192.2, 258; 375/344; 348/735; 331/175, 176
See application file for complete search history.

(56) References Cited

U.S. PATENT DOCUMENTS
5,493,710 A    2/1996   Takahara et al.

FOREIGN PATENT DOCUMENTS

| EP | 1 177 831 A1 | 4/2007 |
|---|---|---|
| JP | 03-209917 | 9/1991 |
| JP | 05-037414 | 2/1993 |
| JP | 7-245563 A | 9/1995 |
| JP | 2003-69426 A | 3/2003 |
| JP | 2007-175577 A | 7/2007 |
| JP | 2008-069032 | 4/2011 |
| WO | WO 2007/013226 A1 | 2/2007 |

OTHER PUBLICATIONS

Clark T.-C. Nguyen et al., Micromachined Devices for Wireless Communications, Proceedings of the IEEE, vol. 86, No. 8, pp. 1756-1768, Aug. 1998.
International Search Report for International Application No. PCT/JP2009/001166, Jun. 16, 2009, Panasonic Corporation.

*Primary Examiner* — Junpeng Chen
(74) *Attorney, Agent, or Firm* — RatnerPrestia

(57) ABSTRACT

A synthesizer includes a synthesizer unit for generating a local oscillation signal based on a reference oscillation signal output from a reference oscillation unit including a MEMS resonator, a frequency fluctuation detector for detecting a frequency fluctuation of the MEMS resonator, and a frequency adjuster for adjusting a frequency of the local oscillation signal based on the frequency fluctuation detected by the frequency fluctuation detector. This synthesizer can output a signal with a stable frequency, even when an MEMS resonator demonstrating a large fluctuation in an oscillation frequency to temperatures is used.

8 Claims, 33 Drawing Sheets

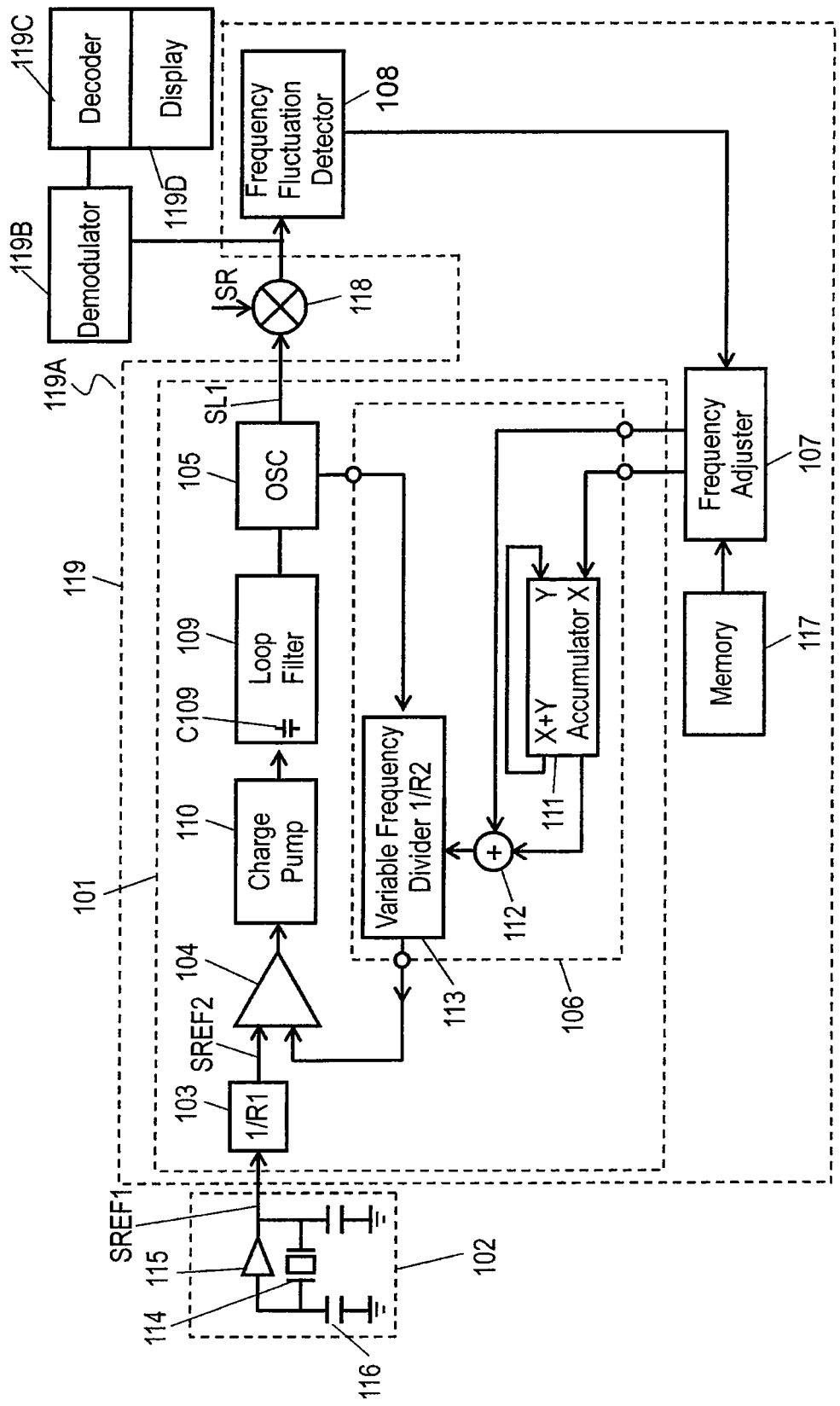

FIG. 2B

| Frequency Difference Condition | Frequency Adjustment Resolution (Hz) | Frequency Adjustment Resolution Ratio (ppm) | First Order Temperature Coefficient α (ppm/°C) | | |
|---|---|---|---|---|---|
| | | | Detection Accuracy of Temperature Sensor ±0.5°C | Detection Accuracy of Temperature Sensor ±0.1°C | Detection Accuracy of Temperature Sensor ±0.05°C |
| Identify Carrier | 1000 | 1.3 | 2.6 | 13 | 26 |

FIG. 9B

| Frequency Difference Condition | Frequency Adjustment Resolution (Hz) | Frequency Adjustment Resolution Ratio (ppm) | First Order Temperature Coefficient α (ppm/°C) | | |
|---|---|---|---|---|---|
| | | | Detection Accuracy of Temperature Sensor ±0.5°C | Detection Accuracy of Temperature Sensor ±0.1°C | Detection Accuracy of Temperature Sensor ±0.05°C |
| Image Receiving | 300 | 0.4 | 0.8 | 4 | 8 |
| Error Free | 100 | 0.12 | 0.24 | 1.2 | 2.4 |

FIG. 9C

| Frequency Difference Condition | Frequency Adjustment Resolution (Hz) | Highest Frequency of Carrier (MHz) | | |
|---|---|---|---|---|
| | | Detection Accuracy of Temperature Sensor ±0.5°C | Detection Accuracy of Temperature Sensor ±0.1°C | Detection Accuracy of Temperature Sensor ±0.05°C |
| Identify Carrier | 1000 | 66.67 | 333.33 | 666.67 |

FIG. 9D

| Frequency Difference Condition | Frequency Adjustment Resolution (Hz) | Highest Frequency of Carrier (MHz) | | |
|---|---|---|---|---|
| | | Detection Accuracy of Temperature Sensor ±0.5°C | Detection Accuracy of Temperature Sensor ±0.1°C | Detection Accuracy of Temperature Sensor ±0.05°C |
| Image Receiving | 300 | 20.00 | 100.00 | 200.00 |
| Error Free | 100 | 6.67 | 33.33 | 66.67 |

SYNTHESIZER AND RECEPTION DEVICE

This Application is a U.S. National Phase Application of PCT International Application PCT/JP2009/001166.

TECHNICAL FIELD

The present invention relates to a synthesizer, and a receiver using the synthesizer.

BACKGROUND ART

Microelectromechanical systems (MEMS) technology is for manufacturing devices using a technique of microfabrication of semiconductor material, such as silicon. The MEMS technology facilitates mass production, downsizing, and cost-reduction of devices, as well as integration of the devices with integrated circuits (ICs). The MEMS technology is widely used in manufacturing sensors, actuators, and filters, such as acceleration sensors, angular acceleration sensors, inkjet printer heads, and high frequency filters.

Mechanical characteristics, such as dimensions and an elastic modulus, of the devices manufactured from a semiconductor material by the MEMS technology vary due to a change in ambient temperatures. A resonance frequency of a MEMS resonator, a device manufactured by the MEMS technology, depends on its dimensions (a thermal expansion coefficient) and an elastic modulus of the material. Accordingly, a change in the oscillating frequency of the MEMS resonator due to the temperature change is much larger than that of a crystal resonator, and frequency temperature characteristics that indicate the change in the oscillating frequency to the temperature change is not very favorable. For example, in an oscillation mode in which the frequency is determined based on a length, the frequency of the oscillation of the MEMS resonator decreases when the material expands as the temperature rises. In addition, when the material becomes softer due to the decrease of the elastic modulus along with the temperature rise, the frequency of the oscillation decreases. For example, a frequency of a silicon resonator, a MEMS resonator, changes by +30 ppm as the temperature changes by 1° C. Thus, an MEMS device is not easily used as a reference oscillator unit that generates a high frequency wave used for clocks for determining operational timing, broadcasting, and communication.

While mechanical characteristics of a crystal resonator made from crystals also change according to the temperature, it is possible to provide superior frequency temperature characteristics by changing its cut angle as the crystals are an anisotropic single crystal material. Thus, crystal resonators are used as reference resonators in various electronic devices.

However, crystal resonators can hardly have a small size or a low profile. due to a processing method and a shape of the crystal resonators. Crystal resonators cannot have their cost reduced since complicated adjustment steps are required. Even though ICs have a small size, the size of a receiver is not reduced due to the large size of crystal resonators.

In order to use an MEMS resonator as a reference resonator, the change of a frequency due to the temperature is compensated. FIG. 33 is a block diagram of conventional synthesizer 201 described in Patent Document 1. Synthesizer 201 compensates the change of an oscillation frequency due to a temperature of reference oscillation unit 202. Synthesizer 201 includes voltage controlled oscillator (VCO) 206 capable of changing an oscillation frequency, frequency divider 207 that frequency-divides an oscillation signal output from the VCO, frequency divider 203 that frequency-divides an oscillation signal output from reference oscillation unit 202, comparator 204 that outputs a signal according to a phase difference between the signals divided by frequency dividers 203 and 207, and lowpass filter (LPF) 205 that integrates the signal output from comparator 204. LPF 205 integrates the signal output from comparator 204, and converts the signal into a voltage having a frequency close to that of a direct current. Based on this voltage, VCO 206 changes the frequency of the oscillation signal and outputs as a local oscillation signal. Temperature sensor 208 detects an ambient temperature of reference oscillation unit 202. Control circuit 211 determines a dividing ratio for frequency divider 207 based on a channel to be received and the detected temperature. Temperature sensor 208 outputs an analog signal based on the detected temperature. This analog signal is converted into a digital signal by analog/digital (A/D) converter 209. Nonvolatile memory 210 previously stores plural correction values respectively corresponding to plural temperatures, and reads one of the plural correction values based on the digital signal output from A/D converter 209 and transmits the read value to control circuit 211. Control circuit 211 determines the frequency dividing ratio of frequency divider 207 based on the transmitted correction value.

In synthesizer 201, detection accuracy of temperature sensor 208 is on the order of ±0.1° C. Thus, reference oscillation unit 202 either carries out oscillation using a resonator, such as a crystal resonator, having a changing rate of the frequency to the temperature is small, or is used in a system that does not require favorable frequency temperature characteristics.

Patent Document 1: JP03-209917A

SUMMARY OF THE INVENTION

A synthesizer includes a synthesizer unit for generating a local oscillation signal based on a reference oscillation signal output from a reference oscillation unit including a MEMS resonator, a frequency fluctuation detector for detecting a frequency fluctuation of the MEMS resonator, and a frequency adjuster for adjusting a frequency of the local oscillation signal based on the frequency fluctuation detected by the frequency fluctuation detector.

This synthesizer can output a signal with a stable frequency, even when an MEMS resonator demonstrating a large fluctuation in an'oscillation frequency to temperatures is used.

BRIEF DESCRIPTION OF THE DRAWINGS

FIG. 1 is a block diagram of a receiver including a synthesizer according to Exemplary Embodiment 1 of the present invention.

FIG. 2B shows a first-order temperature coefficient of a resonator of the receiver according to Embodiment 1.

FIG. 9B shows a first-order temperature coefficient of a resonator of the receiver according to Embodiment 2.

FIG. 9C shows a first-order temperature coefficient of the resonator of the receiver according to Embodiment 2.

FIG. 9D shows a first-order temperature coefficient of the resonator of the receiver according to Embodiment 2.

REFERENCE NUMERALS

Figure 2A:
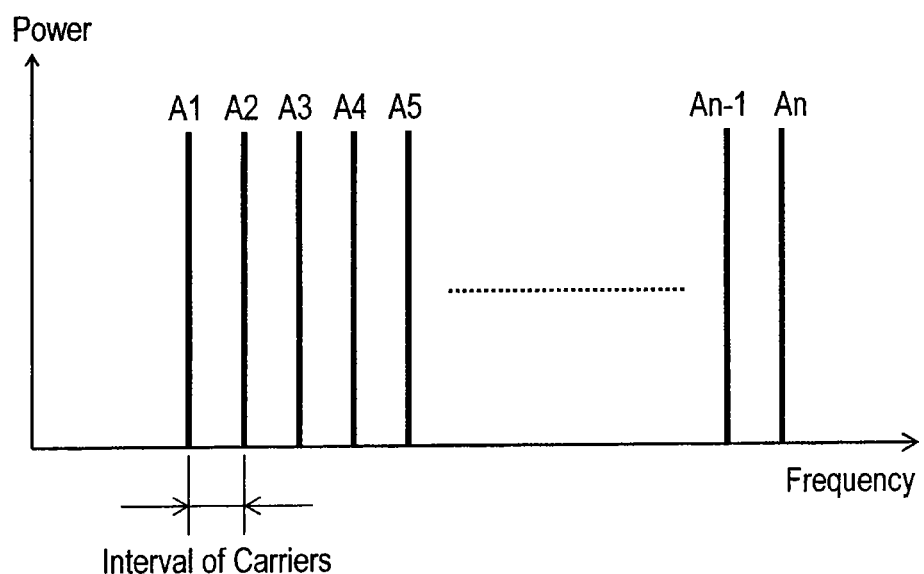
FIG. 2A shows a frequency distribution of carriers of received signals of the receiver according to Embodiment 1.

101 Synthesizer Unit (First Synthesizer Unit)
102 Reference Oscillation Unit
107 Frequency Adjuster (First Frequency Adjuster)
108 Frequency Fluctuation Detector
114 MEMS Resonator
118 Frequency Converter (First Frequency Converter)
121 Synthesizer Unit (Second Synthesizer Unit)
122 Frequency Converter (Second Frequency Converter)
125 Frequency Adjuster (Second Frequency Adjuster)
126 Temperature Sensor
   119N Semiconductor Substrate (First Semiconductor Substrate)
119P Semiconductor Substrate (Second Semiconductor Substrate)
1002 Frequency Converter (First Frequency Converter)
1003 Synthesizer Unit (First Synthesizer Unit)
1004 Reference Oscillation Unit
1005 Temperature Sensor
1006 Frequency Adjuster (First Frequency Adjuster)
1007 Frequency Converter (Second Frequency Converter)
1008 Synthesizer Unit (Second Synthesizer Unit)
1010 Frequency Adjuster (Second Frequency Adjuster)
1011 Demodulator
1011B Display
1903 Controller
2303 Controller
2305 Demodulator
2403 Controller
2703 Demodulator

DETAIL DESCRIPTION OF PREFERRED EMBODIMENTS

Exemplary Embodiment 1

FIG. 1 is a block diagram of receiver 119A provided including synthesizer 119 according to Exemplary Embodiment 1 of the present invention. Synthesizer 119 includes synthesizer unit 101 that generates a local oscillation signal based on reference oscillation signal SREF1 output from reference oscillation unit 102 including an oscillator, frequency fluctuation detector 108 that detects a frequency fluctuation of reference oscillation signal SREF1 based on local oscillation signal SL1 output from synthesizer unit 101, memory 117, and frequency adjuster 107 that adjusts frequency fL1 of local oscillation signal SL1 referring to memory 117 based on the frequency fluctuation detected by frequency fluctuation detector 108.

Receiver 119A includes reference oscillation unit 102 that supplies reference oscillation signal SREF1 into synthesizer 119, and frequency converter 118 that heterodynes received signal SR with using local oscillation signal SL1 output from synthesizer 119.

Synthesizer unit 101 includes frequency divider 103 that frequency-divides reference oscillation signal SREF1 from reference oscillation unit 102 with a predetermined dividing ratio R1. Frequency divider 103 converts reference oscillation signal SREF1 with frequency fREF1 into reference oscillation signal SREF2 with frequency fREF2.

$$fREF2 = fREF1 \times (1/R1).$$

Synthesizer unit 101 further includes oscillation unit 105 that outputs local oscillation signal SL1, frequency divider 106 that frequency-divides frequency fL1 of local oscillation signal SL1 by dividing ratio R2 and to generate divided signal SD1, and frequency adjuster 107 that controls dividing ratio R2 of frequency divider 106. Oscillation unit 105 is implemented by a voltage-controlled oscillator (VCO). Synthesizer unit 101 includes comparator 104 that compares reference oscillation signal SREF2 output from frequency divider 103 to divided signal SD1 output from frequency divider 106, and outputs a signal according to the comparison result. Comparator 104 may compare reference oscillation signal SREF2 in a phase, a frequency, both of a phase and a frequency, or an amount of delay of divided signal SD2. According to Embodiment 1, comparator 104 is a phase/frequency comparator that compares reference oscillation signal SREF2 to divided signal SD2 in a phase and a frequency. Synthesizer unit 101 includes charge pump 110 connected to an output of comparator 104, and loop filter 109 connected to an output of the charge pump. Charge pump 110 can be implemented by a current source and a switch. Loop filter 109 is, e.g. a lowpass filter.

Frequency divider 106 includes accumulator 111 connected to an output of frequency adjuster 107, adder 112 that adds an output of accumulator 111 and an output of an frequency adjuster 107 to output dividing ratio R2, and variable frequency divider 113 that frequency-divides local oscillation signal SL1 by dividing ratio R2. Upon being averaged in a long period of time, dividing ratio R2 of variable frequency divider 113 becomes a fraction.

Reference oscillation unit 102 includes resonator 114, driver circuit 115 that drives resonator 114, and load capacitor 116 that adjusts frequency fREF1 and stabilizes an operation. Resonator 114 is an MEMS resonator that is made of semiconductor material, such as silicon, microfabricated using the microelectromechanical systems (MEMS) technology In synthesizer 119, dividing ratio R2 of frequency divider 106 is very finely controlled according to the temperature. The reason why such a fine adjustment is required will be described with reference to the ISDB-T standard, a digital television broadcasting system in Japan.

The ISDB-T standard employs an orthogonal frequency division multiplexing (OFDM). A receiving bandwidth of the ISDB-T standard is about 5.6 MHz, and is divided into thirteen segments. Twelve segments out of thirteen 13 segments are used for household-use televisions (hereinafter referred to as full segments), and one segment is used for mobile televisions, such as mobile telephones. The OFDM employs a multi-carrier system. FIG. 2A shows a frequency distribution of carriers of a single receiving channel of the OFDM. In FIG. 2A, the horizontal axis represents frequencies of carriers, and the vertical axis represents power intensity of the carriers. For example, according to the Mode 3 of an One-Segment system, 433 carriers are aligned at a frequency interval of about 1 kHz, hence constituting a single received channel. Accordingly, in order to identify adjacent carriers and detect and demodulate received signal SR, accuracy within 1 kHz is required. Generally, received signal SR is multiplied with local oscillation signal SL1 to be heterodyned into an intermediate frequency (IF) signal with an intermediate frequency, such as 560 kHz, lower than that of received signal SR, for example. The difference between the frequency of received signal SR and the frequency of the (IF) signal is required to be not larger than the frequency interval, 1 kHz, of the carriers. Specifically, a frequency difference which is the difference between the frequencies of local oscillation signals for receiving the corresponding carriers is required to be within the frequency interval of the carriers. Frequency fL1 of local oscillation signal SL1 is required to adjust within a range of the frequency interval. This condition for the frequency difference to be within 1 kHz is hereinafter referred to as a "frequency difference condition for identifying the carriers".

In Japan, a signal band frequency used in the digital television broadcasting is the UHF band (470 MHz to 770 MHz). For example, in order to realize a frequency adjustment resolution of 1 kHz (hereinafter referred to as a predetermined frequency adjustment resolution) required as the frequency difference condition for identifying the carriers at a maximum frequency of 770 MHz in the band frequency, the following frequency adjustment resolution ratio is needed.

(Predetermined Frequency Resolution Ratio)=(Frequency Adjustment Resolution)/(Maximum Carrier Frequency)

Under the above condition, the predetermined frequency resolution ratio is 1.3 ppm (=1 kHz/770 MHz). Conventional synthesizer 201 shown in FIG. 33 can hardly realize such a small resolution ratio with a resonator manufactured using the MEMS technology.

Next, an operation of synthesizer 119 according to Embodiment 1 will be described. Frequency divider 103 frequency-divides reference oscillation signal SREF1 having frequency fREF1 from reference oscillation unit 102 by dividing ratio R1, and transmits reference oscillation signal SREF2 having frequency fREF2 (=fREF1/R1) to comparator 104. Oscillation unit 105 outputs local oscillation signal SL1 based on a signal output from comparator 104. According to Embodiment 1, charge pump 110 converts the signal output from comparator 104 into a current. Loop filter 109 extracts a component of the current near a direct current and supplies the extracted component to oscillation unit 105. Oscillation unit 105 generates local oscillation signal SL1 with frequency fL1 that corresponds to this component. Loop filter 109 includes capacitor C109 that is charged and discharged with a current output form charge pump 110, and capacitor C109 generates a voltage proportional to a value obtained by integrating the current. Loop filter 109 cuts a high frequency component in the voltage and outputs a voltage only of a low frequency component including the direct current to oscillation unit 105. Oscillation unit 105 is configured as a voltage-controlled oscillator (VCO) that outputs local oscillation signal SL1 having frequency fL1 corresponding to the voltage.

Frequency divider 106 outputs, to comparator 104, divided signal SD1 obtained by dividing local oscillation signal SL1 by dividing ratio R2 that is controlled by frequency adjuster 107. Frequency adjuster 107 controls dividing ratio R2 so as to correct a fluctuation of frequency fREF1 of reference oscillation unit 102 to the temperature based on a signal output by frequency fluctuation detector 108. Frequency adjuster 107 may control dividing ratio R2 in order to change frequency fL1 of local oscillation signal SL1 when switching a channel to be received, in addition to the correction of the fluctuation of frequency fREF1. Comparator 104 compares reference oscillation signal SREF2 to divided signal SD1, and outputs a signal corresponding to the comparison result to charge pump 110. According to Embodiment 1, comparator 104 is a phase/frequency comparator that compares signals SREF2 and SD1 in, and thus, outputs a signal without inversing positive and negative signs even when the phase difference between signals SREF2 and SD1 is larger than $2\times\pi$.

An operation of frequency divider 106 will be described below.

Frequency adjuster 107 changes dividing ratio R2 of frequency divider 106. Frequency divider 106 changes dividing ratio R2 to suppress a fluctuation of frequency fL1 of local oscillation signal SL1 output from oscillation unit 105. Synthesizer 119 can stabilize frequency fL1 of local oscillation signal SL1 even if frequency FREF1 of reference oscillation unit 102 fluctuates due to ambient conditions, such as the temperature. Frequency adjuster 107 outputs integer dividing ratio M and fraction dividing ratio N to frequency divider 106. Fraction dividing ratio N represents a number that is smaller than "1", which cannot be expressed by integer dividing ratio M representing an integer. Accumulator 111 adds fraction dividing ratio N to output "1" upon producing an overflow and to output "0" upon producing no overflow. Adder 112 adds "0" or "1" output from accumulator 111 to integer dividing ratio M to determine frequency dividing ratio R2 of variable frequency divider 113 as "M" or "M+1". Upon switching alternately between frequency dividing ratios "M" and "M+1", accumulator 111 produces frequency dividing ratio R2 substantially representing a fraction number. For example, in the case that numbers calculated by accumulator 111 have k bits, frequency dividing ratio R2 and frequency fL1 of local oscillation signal SL1 are expressed by formula 1 and formula 2 as shown below.

$$R2 = M + N/2^k \quad (1)$$

$$fL1 = (M+N/2^k) \times fREF2 = (M+N/2^k) \quad (2)$$

Larger bit number k of accumulator 111 allows to adjust frequency fL1 more finely. Bit number k is determined such that a minimum adjustment range of frequency fL1 is not greater than the predetermined frequency adjustment resolution, as described above.

However, types of resonator 114 that can be used are limited depending on accuracy of the temperature sensor that detects the temperature even if the frequency adjustment resolution is fine. In conventional synthesizer 201 shown in FIG. 33, the dividing ratio of frequency divider 207 is determined based on the temperature detected by temperature sensor 208. Thus, an absolute value and accuracy of the frequency adjustment resolution are determined according to the detection resolution and the detection accuracy for the temperature of temperature sensor 208. In particular, the detection accuracy for the temperature is important and relates to reliability of the dividing ratio.

Temperature sensor 208 is often implemented by devices, such as semiconductor-based sensors and thermistors, that utilize temperature characteristics of a current that flows through semiconductor. Frequency-temperature characteristics of a resonator required to such devices used for temperature sensor 208 will be described below. FIG. 2B shows absolute values of a first order temperature coefficient of a resonator that is required when devices respectively having temperature accuracy of ±0.5° C., ±0.1° C., and ±0.05° C. are used as temperature sensor 208.

While semiconductor-based devices have various advantages, such as size and cost reduction and incorporation in ICs, the semiconductor-based devices often have accuracy of about ±0.5° C. These devices have the highest accuracy among devices without adjustment. When temperature sensor 208 has a temperature accuracy of ±0.5° C., a dividing ratio adjusted for the fluctuation of the temperature by ±0.5° C. is not reliable. In other words, if a fluctuation range of the frequency of the local oscillation signal for the temperature fluctuates by ±0.5° C. excesses the predetermined frequency adjustment resolution, the fluctuation range reduces reliability of the adjusted dividing ratio.

The frequency temperature characteristics of the resonator will be described below. Changing amount δf of resonance frequency f of the resonator and frequency fluctuation ratio δf/f for the temperature change from reference temperature T0 to temperature T is expressed as formula 3.

$$\delta f/f = \alpha \times (T-T0) + \beta \times (T-T0)^2 + \gamma \times (T-T0)^3 \quad (3)$$

Number α, number β, and number γ are a first order temperature coefficient, a second order temperature coefficient, and a third order temperature coefficient, respectively. First order temperature coefficient α is a ratio of a frequency change for the temperature change of 1° C. to an initial frequency. The temperature accuracy of ±0.5° C. indicates that an error of 0.5° C. from a true temperature to both positive and negative sides can be involved. For example, when a true value of the temperature is 25° C., a value detected by a temperature sensor with a temperature accuracy of ±0.5° C. ranges from 24.5° C. to 25.5° C. Here, the maximum difference from the true value of the temperature is 0.5° C. In order to indicate the temperature accuracy by an absolute value, only the temperature accuracy on the positive side is considered. When assuming that first order temperature coefficient α (ppm/° C.) of the oscillation frequency of the resonator is dominant over the frequency change according to the temperature, formula 4 as described below is required to be established.

$$(\text{Temperature Accuracy on Positive Side}) \times = \alpha | \leq (\text{Predetermined Frequency Adjustment Resolution}) \quad (4)$$

Here, as temperature accuracy on the positive side is 0.5 (ppm/° C.), formula 4 can be modified as follows.

$$|\alpha| \leq (\text{Predetermined Frequency Adjustment Resolution Ratio})/0.5 \quad (4A)$$

Since the predetermined frequency adjustment resolution ratio that satisfies the frequency difference condition for identifying the carriers is 1.3, the absolute value of the frequency temperature characteristic of the resonator is required to be 2.6 ppm/° C. (=1.3·10.5).

If semiconductor-based devices having a variation between pieces is optimized and adjusted individually are used as temperature sensor 206, the temperature accuracy of temperature sensor 208 can be improved to about ±0.1° C. Based on formula 4A, the absolute value of the frequency temperature characteristic of the resonator is required to be not larger than 13 ppm/° C. (=1.3/0.1).

Upon being implemented by a thermistor, temperature sensor 208 can have the accuracy of about ±0.05° C. In this case, based on formula 4A, the absolute value of the frequency temperature characteristic of the resonator is required to be not larger than 26 ppm/° C. (=1.3/0.05).

Crystal resonators have first order temperature coefficient α of a crystal resonator is 0, a very small second order temperature coefficient, and a very small third order temperature coefficient. In general, second order temperature coefficient β is smaller than first order temperature coefficient α, and second order temperature coefficient β is smaller than third order temperature coefficient γ. Accordingly, an influence given to the frequency temperature characteristic by temperature coefficient β or temperature coefficient γ is smaller than that of first order temperature coefficient α. Thus, a frequency temperature characteristic of a crystal resonator having first order temperature coefficient α of 0 is extremely preferable, accordingly providing only a very small fluctuation of the resonance frequency due to the temperature.

The temperature coefficients of the crystal resonator change depending on a cutting angle at which a crystal ingot that is a solid crystal after pulling is cut into a crystal plate. AT-cut crystal resonators are a type of crystal resonators that are most widely used due to their excellent frequency temperature characteristic. A typical AT-cut crystal resonator has a frequency fluctuation ratio ranging, e.g. from about ±20 ppm to ±100 ppm within a temperature range of use (−40° C. to 85° C.). A slight difference in the cutting angle determines a range of the frequency fluctuation ratio.

Figure 33:
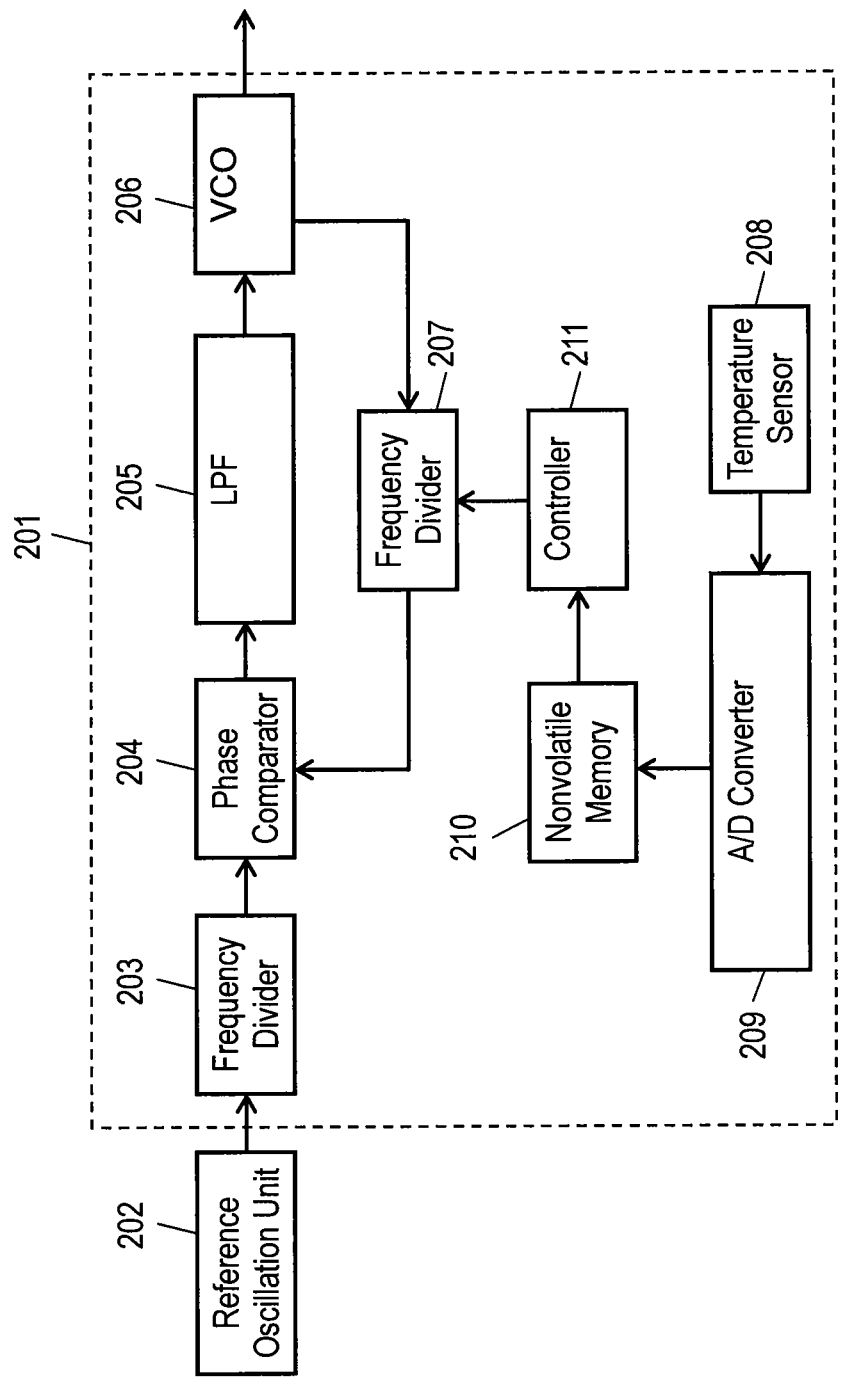
FIG. 33 is a block diagram of a conventional synthesizer.

Conventional synthesizer 201 shown in FIG. 33 including reference oscillation unit 202 utilizing an AT-cut crystal resonator was manufactured and evaluated. This resonator had an extremely good frequency temperature characteristic of about ±20 ppm within a temperature range of use from −40° C. to 85° C. For electronic apparatuses, such as televisions and mobile telephones, resonators having characteristics of this level are commonly used. First order temperature coefficient α of the AT-cut crystal resonator was 0, and a slope of the frequency temperature characteristic was at a room temperature, and became larger at higher or lower than the room temperature. First order temperature coefficient αP of this resonator was obtained virtually by averaging the frequency temperature characteristic within the temperature range of use, and virtual temperature coefficient αP was 0.32 ppm/°C. (=40 ppm/125° C.).

First order temperature coefficient α of the silicon resonator made of silicon manufactured using the MEMS technology is about −30 ppm/°C. In the temperature range of use described above, since first order temperature coefficient α is dominant over the frequency temperature characteristic, the fluctuation ratio of the frequency will be described below without considering second order temperature coefficient β and third order temperature coefficient γ.

Virtual first order temperature coefficient αP of the crystal resonator is 0.32 ppm/°C., satisfying the condition shown in FIG. 2B. First order temperature coefficient α of the silicon resonator is −30 ppm/°C., which can hardly satisfy the condition shown in FIG. 2B.

Next, accuracy required for temperature sensor 208 in order to satisfy a frequency difference condition for identifying the carriers of the silicon resonator will be described. Formula 4 is modified to obtain formula 5 below.

$$\text{(Temperature Accuracy on Positive Side)} \le \text{(Predetermined Frequency Adjustment Resolution Ratio)}/|\alpha| \quad (5)$$

Since the absolute value of the predetermined frequency adjustment resolution ratio is required to be not larger than 1.3 ppm and $|\alpha|=30$ ppm/°C., the temperature accuracy of temperature sensor 208 is required to be not larger than ±0.043° C.

In synthesizer 119 shown in FIG. 1, frequency fluctuation detector 108 detects a difference between known frequency fc of received signal SR and frequency fL1 of local oscillation signal SL1 output from synthesizer unit 101, and obtains the value of the temperature from the detected difference and transmits the obtained value to frequency adjuster 107, instead of conventional temperature sensor 208. If the frequency temperature characteristic of resonator 114 is known, frequency adjuster 107 can control dividing ratio R2 of frequency divider 106 based on the obtained temperature. Memory 117 previously stores dividing ratio R2 and the value of the temperature obtained from the difference between the frequencies. Frequency adjuster 107 reads the value of the temperature from memory 117 based on the difference between the frequencies transmitted from frequency fluctuation detector 108, and determines dividing ratio R2 of frequency divider 106.

Dividing ratio R2 may be calculated directly from the difference of the frequencies, instead of converting the difference between the frequencies output from frequency fluctuation detector 108 into the value of the temperature. The number of bits k of accumulator 111 and frequency fREF2 of reference oscillation signal SREF2 provides minimum range Δ div for adjusting the frequency as the formula below.

$$\Delta \text{ div}=fREF2/2^k$$

Based on frequency difference ΔF and minimum range Δ div output from frequency fluctuation detector 108, in order to make frequency difference ΔF be 0, frequency adjuster 107 increases dividing ratio R2 of frequency divider 106 by correction number ΔF/Δ div. In order to realize such control, memory 117 may store plural values of difference ΔF and correction numbers ΔF/Δ div corresponding to the plural values of difference ΔF, respectively. In this case, frequency adjuster 107 determines dividing ratio R2 based on a value of correction number ΔF/Δ div corresponding to a value of difference ΔF from memory 117. Alternatively, frequency adjuster 107 may control dividing ratio R2 by calculating correction number ΔF/Δ div from difference ΔF. Here, the number of bits k of the accumulator determines the maximum value of the accumulator to be $2^k$, and Δ div=fREF2/$2^k$.

Figure 3:
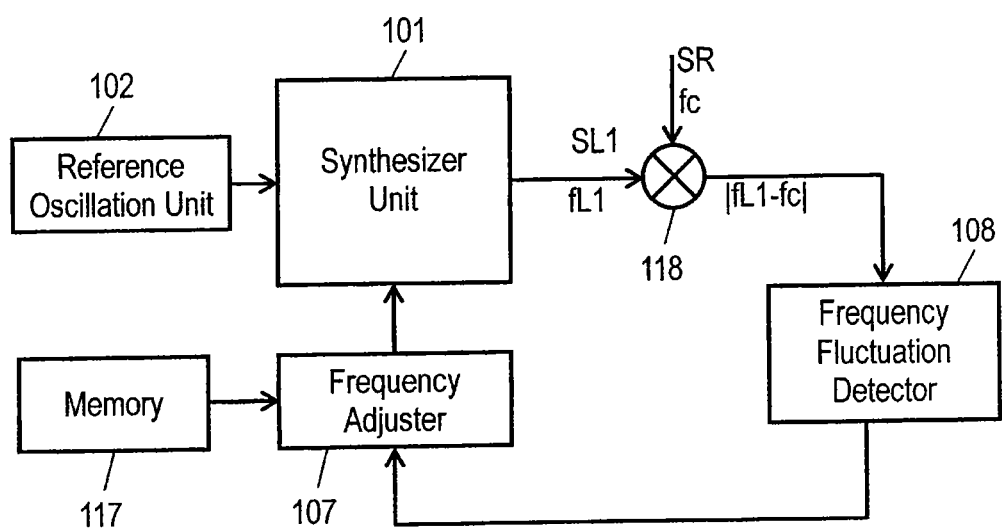
FIG. 3 is a block diagram of the synthesizer according to Embodiment 1 for illustrating an operation of the synthesizer.

Detection of the temperature will be described in detail below. FIG. 3 is a block diagram of synthesizer 119 shown in FIG. 1 for illustrating an operation of synthesizer 119. Frequency converter 118 multiplies received signal SR of frequency fc with local oscillation signal SL1 of frequency fL1 output from synthesizer unit 101 to generate two signals of frequencies |fL1−fc| and |fL1+fc|. Frequency converter 118 has a lowpass filter function to remove the signal of frequency |fL1+fc| out of the two signals of frequency converter 118 and to output only the signal of frequency |fL1−fc|. Actual frequency fc of received signal SR often deviates from original frequency fc0 by difference Δfc1, as expressed by the following formula.

$$fc=fc0+\Delta fc1$$

Frequency fL1 of local oscillation signal SL1 is expressed by the formula from original frequency fc0 and frequency fluctuation Δft produced due to the frequency temperature characteristic of resonator 114.

$$fL1=fc0+\Delta ft$$

The accurate frequency of the signal output from frequency converter 118 is expressed as follows.

$$|fL1-fc|=\Delta ft-\Delta fc1$$

Here, since Δft≫Δfc1, the above formula can be read as follows.

$$|fL1-fc|=\Delta ft$$

In other words, frequency fluctuation Δft produced due to the temperature of resonator 114 is substantially detected as frequency |fL−fc|, thus allowing frequency fluctuation detector 108 to function as a temperature sensor.

A factor causing difference Δfc1 between actual received signal SR and original frequency fc0 includes an initial frequency variation, at a broadcasting station, in reference oscillation signals that is supplied to a synthesizer that generates carriers. At the broadcasting station, a crystal resonator to which initial adjustment is performed is often used as a resonator for a reference oscillation unit that generates a reference oscillation signal. The initial frequency variation of this crystal resonator is suppressed to about ±2 ppm. A carrier having a frequency of 770 MHz has a variation, i.e., difference Δfc1 of 11.5 kHz. In contrast, frequency fluctuation Δft of resonator 114 in an entire temperature range of use from −40° C. to 85° C. is expressed by the following formula.

$$\Delta ft=fc\times\{85-(-40)\}\times30 \text{ (ppm/°C.)}=fc\times3750 \text{ (ppm)}$$

Received signal SR having frequency fc of 770 MHz has frequency fluctuation Δft of 2888 kHz. The ratio of 150 pp, of frequency fluctuation Δft to frequency fc causes even a temperature change of 5° C. to provide frequency fluctuation Δft of 115.5 kHz, which is notably larger than difference Δfc1 of 15 kHz.

Since difference Δfc1 at the broadcasting station does not fluctuate by time and temperature, even when the relation Δft>>Δfc1 is not established, Frequency fL1 of local oscillation signal SL1 is corrected to the initial value in receiving, establishing a relation Δfc1≈0.

Frequency fluctuation detector 108 is implemented by a frequency discriminator that outputs a frequency change of an input signal as a voltage change, or by a circuit, such as a frequency counter, that detects a frequency that directly counts a frequency. In this case, since the frequency is converted into a low frequency, frequency fluctuation detector 108 can easily detect difference Δf of the frequency accurately regardless of the carrier frequency (for example, 770 MHz).

Figure 4A:
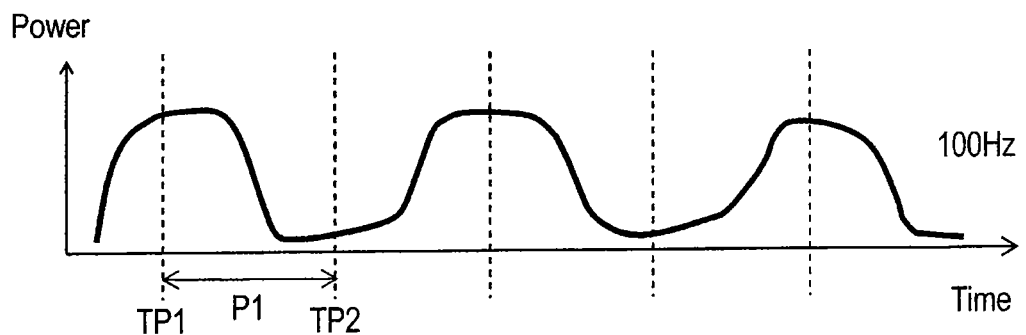
FIG. 4A shows a waveform of a signal for detecting a frequency of the synthesizer according to Embodiment 1.
Figure 4B:
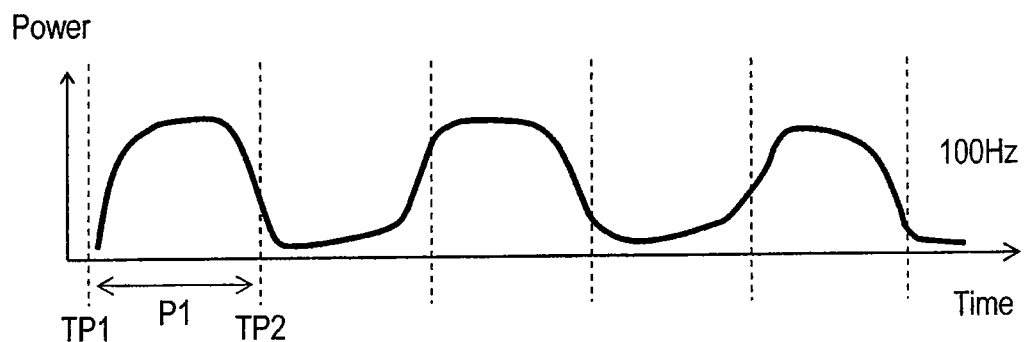
FIG. 4B shows a waveform of a signal for detecting a frequency of the synthesizer according to Embodiment 1.
Figure 4C:
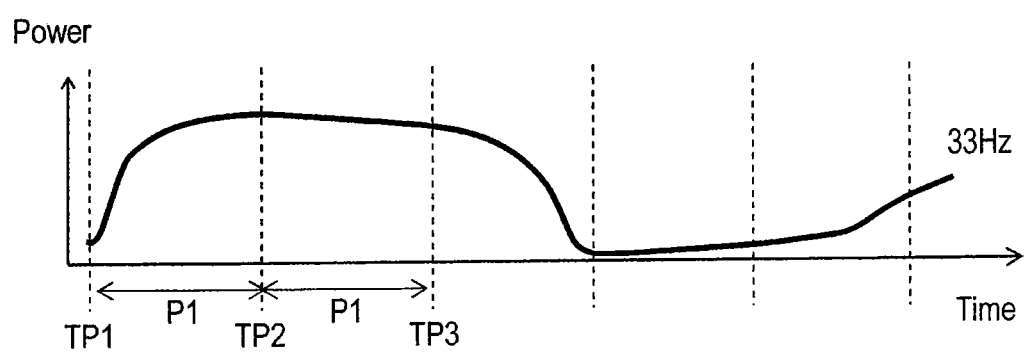
FIG. 4C shows a waveform of a signal for detecting a frequency of the synthesizer according to Embodiment 1.

Here, the accuracy at which frequency fluctuation detector 108 detects difference Δf of the frequency will be described. In the case that frequency fluctuation detector 108 is implemented by a frequency counter, frequency fluctuation detector 108 detects and counts rising and falling of a waveform of the signal, thereby detecting the frequency. As the frequency decreases, the detection accuracy increases. FIGS. 4A to 4C show waveforms of a signal having a frequency to be detected. The frequency of the signals shown in FIGS. 4A and 4B is 100 Hz, and the frequency of the signal shown in FIG. 4C is 33 Hz. Frequency fluctuation detector 108 detects a level of the signal periodically at a predetermined intervals, such as 5 msec, in FIGS. 4A to 4C. As shown in FIG. 4A, if the level of the signal is high at time point TP1 and then becomes low at next time point TP2, frequency fluctuation detector 108 can detect that the signal falls in a period from time point TP1 to time point TP2. As shown in FIG. 4B, if the level of the signal is low at both time points TP1 and TP2, frequency fluctuation detector 108 cannot correctly detect the frequency of the signal. As shown in FIG. 4C, if the frequency of the signal is low, 33 Hz, the level of the signal at time point TP1 is low and then becomes high at next time point TP2, and therefore, frequency fluctuation detector 108 can detect that the signal rises in a period from time point TP1 to time point TP2. As described above, frequency fluctuation detector 108 can easily detect rising and falling of the signal if the frequency is lower. Period P1, upon being short, raises the frequency that can be detected by frequency fluctuation detector 108 implemented by the frequency counter. However, in general, increasing the operation frequency by shortening period P1 increases a size of the circuit and a current to be consumed of frequency fluctuation detector 108. Accordingly, period P1 is determined according to the amount of the fluctuation of the frequency of resonator 114. The frequency counter that detects rising and falling is implemented by a latch circuit, for example, using an exclusive OR or flip-flop.

Frequency fc of received signal SR according to Embodiment 1 is a single frequency. However, the frequency of received signal SR for television systems of the ISDB-T standard and W-CDMA, and for mobile telephone systems is spread over a specific frequency band. In this case, for example, frequency fc is a center frequency at a center of this frequency band.

In synthesizer 119 according to Embodiment 1, frequency fluctuation detector 108 detects the difference between frequency fc of the received signal and frequency fL1 of local oscillation signal SL1, thereby detecting the temperature. In synthesizer 119 according to Embodiment 1, frequency fluctuation detector 108 can detect a difference between frequency fL1 and a frequency of a different known signal, instead of the received signal. For example, frequency fluctuation detector 108 can detect a difference between frequency fL1 and a frequency of a known signal used for another system in receiver 119A. Further, the received signal is not necessary to be a desired signal that contains actually desired data. For example, a signal for the Global Positioning System (GPS) may be received and used as the received signal.

Receiver 119A according to Embodiment 1 may further include demodulator 119B that demodulates a signal output from frequency converter 118, decoder 119C that decodes the signal demodulated by demodulator 119B, and display 119D that displays the signal decoded by decoder 119C. Frequency fluctuation detector 108 may be included in demodulator 119B, or in both of demodulator 119B and decoder 119C. In particular, in the case that the digital processing shown in FIGS. 4A to 4C is used for detecting the frequency, frequency fluctuation detector 108 is included in demodulator 119B to reduce the size of receiver 119A.

Exemplary Embodiment 2

Figure 5:
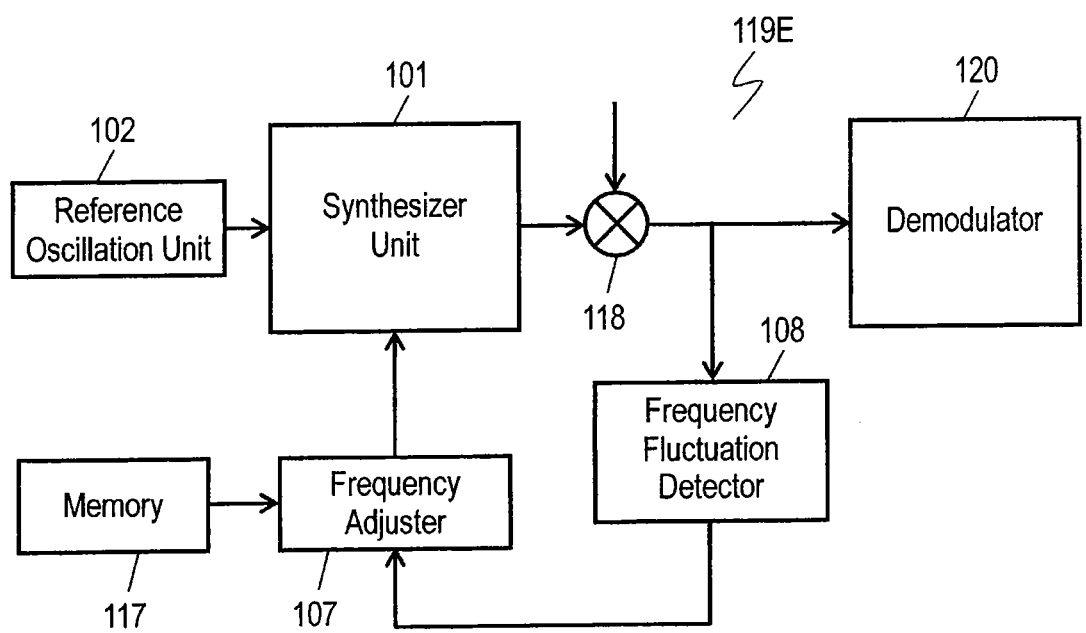
FIG. 5 is a block diagram of a receiver according to Exemplary Embodiment 2.
Figure 6:
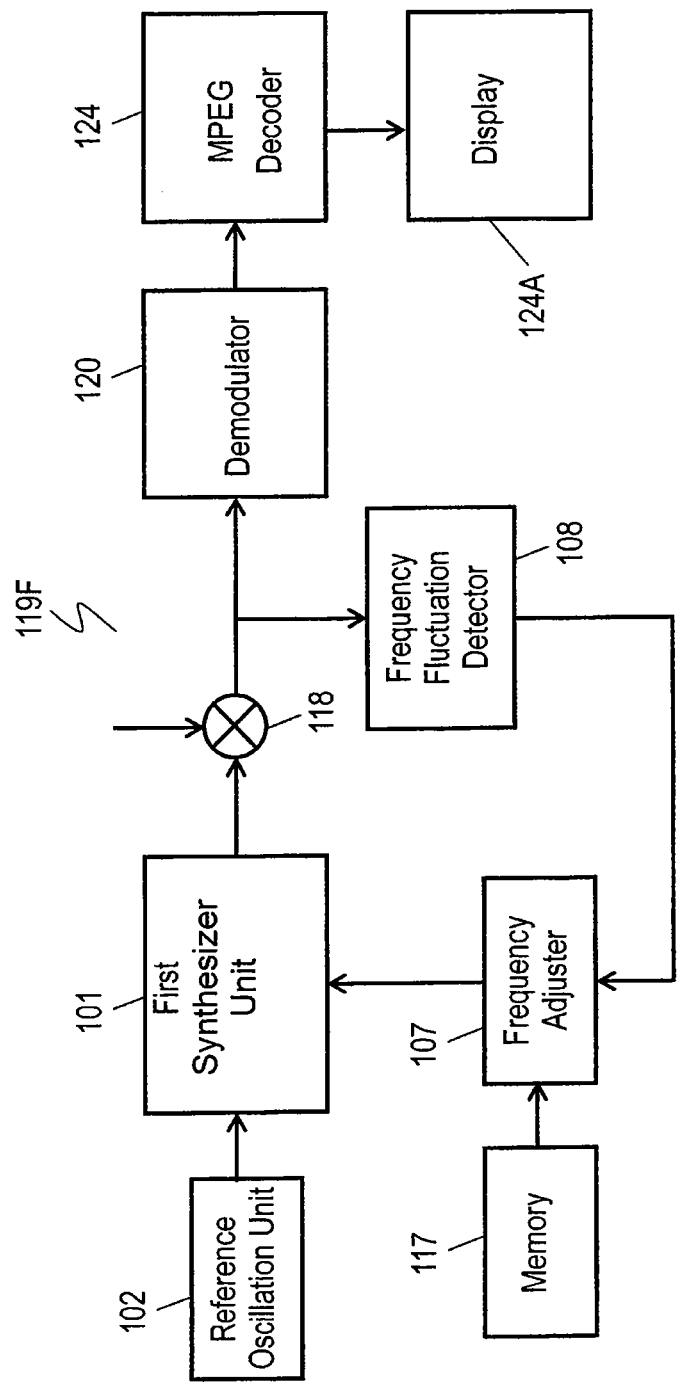
FIG. 6 is a block diagram of another receiver according to Embodiment 2.

FIG. 5 is a block diagram of receiver 119E according to Exemplary Embodiment 2 of the present invention. FIG. 6 is a block diagram of another receiver 119F according to Embodiment 2. In FIGS. 5 and 6, components identical to those of synthesizer 119 shown in FIG. 1 are denoted by the same reference numerals, and their description will be omitted. Receiver 119E shown in FIG. 5 includes demodulator 120 that demodulates a baseband signal. Receiver 119F shown in FIG. 6 includes receiver 119E shown in FIG. 5 and further includes MPEG decoder 124 and display 124A.

While the frequency difference condition of the carrier identify is described according to Embodiment 1, there are various other types of frequency difference conditions, and a predetermined frequency adjustment resolution or a frequency adjustment resolution ratio corresponds to each of these conditions.

Other types of frequency difference conditions include a condition determined by quality of an image displayed on display 124A. A frequency adjustment resolution within 300 Hz prevents the image from visually deteriorating. In the following description, this condition is referred to as "frequency difference condition of image receiving" and corresponds to a required frequency adjustment resolution ratio within 0.4 ppm.

An indication of receiving quality of demodulation is a bit error rate (BER) of received signal SR. Data processed by demodulator 120 to be decoded to a Reed-Solomon code is supplied to MPEG decoder 124 as an MPEG-TS signal. MPEG decoder 124 decodes this signal into an image signal and supplies the image signal to display 124A. Display 124A displays the image signal as an image.

Here, an operation of demodulation such as decode of an error correcting code will be described below. Demodulator 120 performs a deinterleaving and a decoding of an error correcting code. Deinterleaving refers to cancellation of interleaving which is re-aligning of data that has been modulated in modulation in order to reduce a burst error. Successive errors are generally hard to correct. However, burst errors that are successive for a certain period can be converted into random errors by a series of processing of interleaving and deinterleaving, and it is possible to increase error rate that can be improved by the error correction. Further, in systems, such as the ISDB-T for domestic use and the DVB-H for oversea use, Viterbi codes and Reed-Solomon codes are employed as error correcting codes. Decoding of the Viterbi code is first carried out to the signal supplied to demodulator 120. Subsequently, decoding of a Reed-Solomon code is executed. Finally, in order to realize a state having very few errors, or a so-called error free state, it is required that a BER value after decoding the Viterbi code is a certain value, for example, smaller than $2\times10^{-4}$. The "error free" state of receiving quality described here, that is, the BER value smaller than $1\times10^{-11}$ realizes a state that only a few number of bit errors occurs for the receiving for one day.

Receivers 119E and 119F shown in FIGS. 5 and 6 are a direct conversion type that converts a received high frequency wave directly to a signal close to a direct current. In other words, frequency converter 118 converts the received signal into the baseband signal. Another circuit block may be provided between frequency converter 118 and demodulator 120. For example, in the ISDB-T standard, received signal SR is converted into a signal of an intermediate frequency, and further converted into a baseband signal by another frequency converter.

Figure 7:
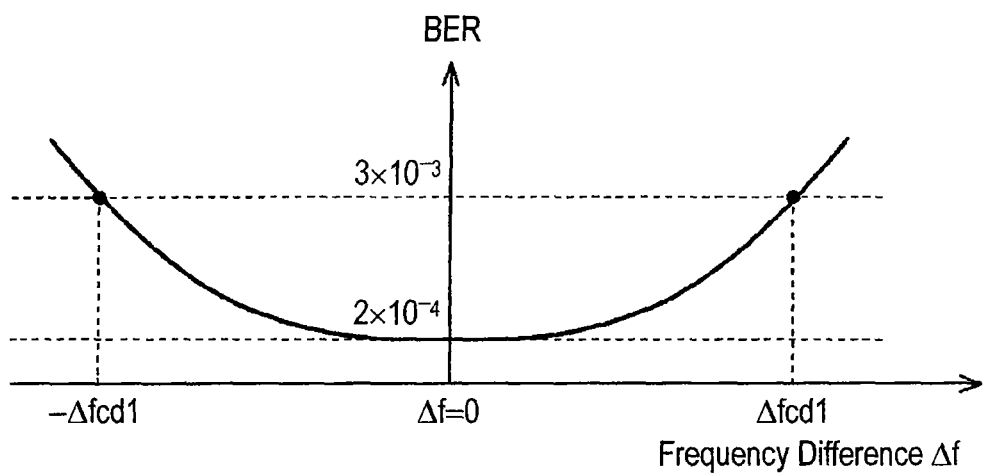
FIG. 7 shows a bit error rate of the receiver according to Embodiment 2.

FIG. 7 shows the BER. In FIG. 7, the vertical axis represents the BER, and the horizontal axis represents frequency difference $\Delta f$. In FIG. 7, the BER comes near a detectable point at $\Delta f=0$. Specifically, the BER after the decoding of the Viterbi code at $\Delta f=0$ is $2\times10^{-4}$. The detectable point refers to a state in which only waves having a level of minimum input sensitivity can be received, which is a minimum required received signal power in order to realize an error free state, and this is a quite poor environment for receiving. In a state that which noises in the image cannot be visually noted, the BER after the decoding of the Viterbi code is required to be $3\times10^{-3}$, and difference $\Delta f$ at this moment is difference $\Delta fcd1$ and difference $-\Delta fcd1$. Difference $\Delta fcd1$ is 150 Hz. Specifically, difference $\Delta f$ is expressed by the following relation.

$$-150\ Hz \le \Delta f \le 150\ Hz$$

Accordingly, the predetermined frequency adjustment resolution is 300 Hz.

Figure 8:
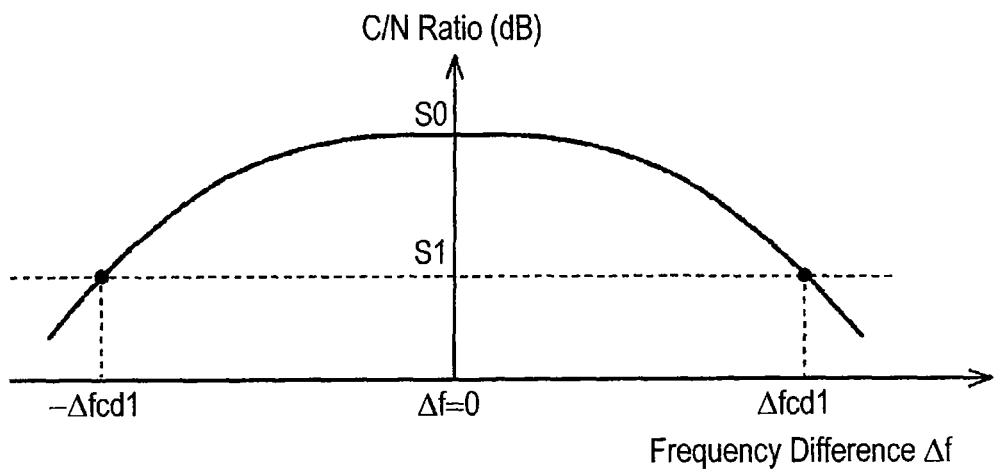
FIG. 8 shows a bit error rate of the receiver according to Embodiment 2.

FIG. 8 shows a carrier/noise (C/N) ratio as an indication for indicating the receiving quality different from the BER. The C/N ratio is a ratio of power of the desired signal (carrier) among received signals to power of noises. In FIG. 8, the vertical axis represents the C/N ratio, and the horizontal axis represents frequency difference $\Delta f$. FIG. 8 shows relation between difference $\Delta f$ and the C/N ratio in the condition that the C/N ratio becomes the detectable point at $\Delta f=0$. As frequency difference $\Delta f$ increases, the C/N ratio decreases and the received quality becomes poor. As frequency difference $\Delta f$ becomes larger than difference $\Delta fcd1$, the C/N ratio becomes smaller than threshold S1 at which noises can be observed in an image. Threshold S1 is smaller than value S0 which is the C/N ratio upon $\Delta f=0$ by about 1 dB. In receivers 119A, 119E, and 119F according to Embodiments 1 and 2, since the fluctuation of frequency fL1 of local oscillation signal SL1 is detected by the signal output by frequency converter 118, the C/N ratio shown in FIG. 8 is the C/N ratio of the signal after frequency converter 118. The C/N ratio can be calculated from, for example, an error vector magnitude (EVM) in a state of constellation before the digital demodulation. Here, differences $\Delta f$ and $\Delta fcd1$ are absolute values.

Figure 9A:
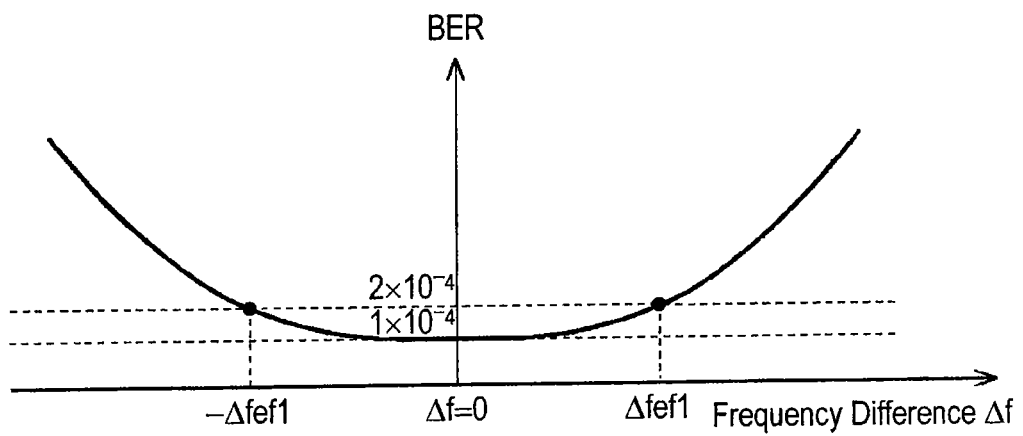
FIG. 9A shows a bit error rate of the receiver according to Embodiment 2.

Further, other frequency difference conditions include an "error free frequency difference condition", with which an error free state can be obtained in which an error of the demodulated signal is substantially zero. Under this condition, the frequency adjustment resolution is 100 Hz. Specifically, it is possible to realize an error free state when frequency fc of received signal SR matches frequency fc of local oscillation signal SL1 within a range of ±50 Hz. This condition corresponds to the frequency adjustment resolution ratio of about 0.24 ppm. FIG. 9A shows the BER that realizes this condition. In FIG. 9A, the vertical axis represents the BER, and the horizontal axis represents difference $\Delta f$. In FIG. 9A, the BER is set to be $1\times10^{-4}$ after the decoding of the Viterbi code at $\Delta f=0$. Originally, the BER that realizes the error free state is $2\times10^{-4}$. However, since synthesizers often include variation in the BER of about $1\times10^{-4}$, the BER at $\Delta f=0$ is set to be $1\times10^{-4}$ in order to obtain the BER of $2\times10^{-4}$ even when there is variation in the receiving quality. In FIG. 9A, the error free state can be realized when thresholds $-\Delta fef1$ and $\Delta fef1$ which are difference $\Delta f$ for the BER of $2\times10^{-4}$, and difference $\Delta f$ satisfy the following relation.

$$-\Delta fef1 \le \Delta f \le \Delta fef1.$$

According to Embodiment 2, $\Delta fef1$ is 50 Hz, therefore the predetermined frequency resolution is 100 Hz. The increase of the BER by $1\times10^{-4}$ corresponds to the decrease of the minimum input sensitivity by about 0.1 dB. For example, difference $\Delta f$ corresponding to the decrease of the minimum input sensitivity by 0.1 dB from the initial state substantially corresponds to differences $\Delta fef1$ and $-\Delta fef1$. Further, difference $\Delta f$ corresponding to the decrease of the C/N ratio by 0.1 dB from the initial state substantially corresponds to differences $\Delta fcd1$ and $-\Delta fcd1$. Accordingly, the BER, the C/N ratio, and the minimum input sensitivity that are the indications of the receiving quality are mutually correlated, and therefore the receiving quality may be evaluated based on any of these. By satisfying the "error free frequency difference condition", it is substantially completely possible to realize the state in which no error affects receiving performance. This is also applied to, in addition to the television systems, other systems, such as telephone systems for mobile telephones and data communication systems, using digital modulation, and provides the same effects.

FIG. 9B shows the first order temperature coefficient of resonator 114 that is required to satisfy the frequency difference condition. The first order temperature coefficient is calculated based on formula 4 similarly to Embodiment 1.

The crystal resonator has virtual first order temperature coefficient $\alpha P$ of 0.32 ppm/° C. and satisfies the frequency difference condition of image receiving in any temperature sensor. Further, the crystal resonator satisfies the error free frequency difference condition in a temperature sensor having temperature accuracy smaller than of ±0.1° C. However, the MEMS resonator made of silicon has first order temperature coefficient $\alpha$ of −30 ppm/° C., and cannot satisfy the frequency difference condition of image receiving or the error free frequency difference condition even in a temperature sensor having a temperature accuracy of ±0.05° C.

For the MEMS resonator made of silicon, from formula 5, a temperature sensor having the accuracy smaller than ±0.013° C. is required in order to satisfy the "frequency difference condition of image receiving". Further, such a resonator is required to have a temperature sensor having the accuracy smaller than ±0.004° C. in order to satisfy the error free frequency difference condition. Temperature sensors, such as semiconductor-based transistors and thermistors, can hardly have such high accuracy, and cannot satisfy these conditions. Receivers 119A, 119E, and 119F according to Embodiments 1 and 2 can satisfy these conditions even using resonator 114 including the MEMS resonator made of silicon.

Figure 10:
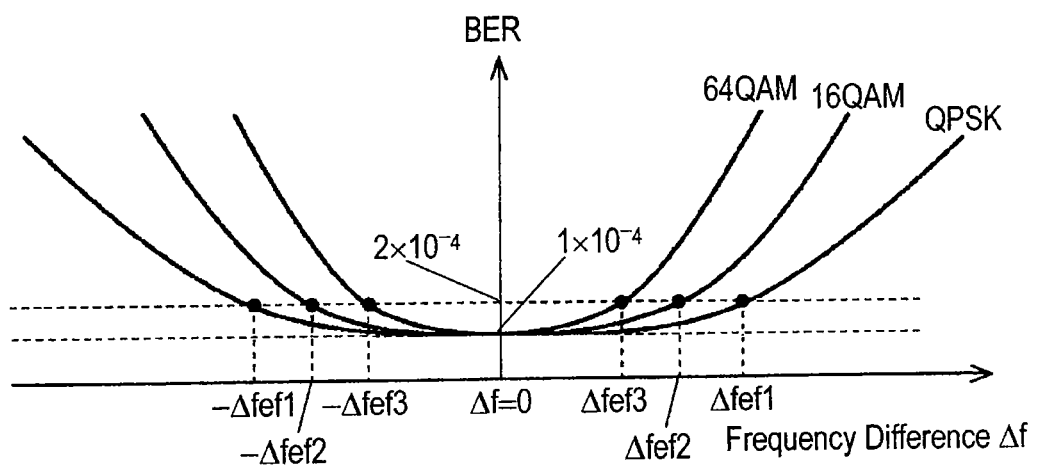
FIG. 10 shows a bit error rate of the receiver according to Embodiment 2.

A predetermined frequency adjustment resolution of 100 Hz ($=2\times\Delta fef1$) is applied to the One-Segment broadcasting of a digital modulation technique in a QPSK system. The predetermined frequency adjustment resolution varies depending on the digital modulation technique. FIG. 10 shows bit error rates of the QPSK system for the One-Segment broadcasting, a 16QAM system for the One-Segment broadcasting, and a 64QAM system for the full-Segment broadcasting. In the 16QAM system, the predetermined frequency adjustment resolution is about 80 Hz (=2×Δfef2). In the 64QAM system, the predetermined frequency adjustment resolution is about 50 Hz (=2×Δfef3). This condition can have the conditions for the temperature sensor calculated. Therefore, unless otherwise stated, an operation of the receiver in the QPSK system for the One-Segment broadcasting will be described below. Further, the operation of the receiver in the QPSK system will be also described regarding the predetermined frequency adjustment resolution (2×Δfcd1) for the "frequency difference condition of image receiving".

Practically, semiconductor-based temperature sensors are often used. Thermistors have a relatively large size, and offset an advantage of the MEMS resonator having a small size, and increase the size of the synthesizer. Accordingly, a practical temperature accuracy of the temperature sensor is ±0.5° C. Further, the accuracy of the temperature sensor that is individually adjusted without considering the cost is ±0.1° C., which is the accuracy obtained by a small synthesizer or the receiver.

Further, practically, the more preferable frequency difference condition is the frequency difference condition of image receiving. This condition, upon being satisfied, causes no practical problem when watching television. Accordingly, as shown in FIG. 9B, considering the accuracy of ±0.1° C., the frequency using the semiconductor-based temperature sensor cannot be compensated when using the MEMS resonator having first order temperature coefficient α larger than 4 ppm/° C. Receivers 119A, 119E, and 119F according to Embodiments 1 and 2 can realize both the downsizing and temperature compensation of the frequency simultaneously.

The error free frequency difference condition, upon being satisfied, allows the receiver to receive data without any error, thus providing a highly reliable receiver. As shown in FIG. 9B, considering the accuracy of ±0.1° C. of the temperature sensor, the frequency using the semiconductor-based temperature sensor cannot be compensated when using the MEMS resonator having first order temperature coefficient α larger than 1.2 ppm/° C. Receivers 119A, 119E, and 119F according to Embodiments 1 and 2 can realize both the downsizing and temperature compensation of the frequency simultaneously.

The MEMS resonator includes, for example, a resonator made of semiconductor, such as silicon, or polysilicon. First order temperature coefficient α of the resonator made of polysilicon is about −22 ppm/° C. Further, a value of first order temperature coefficient α of a resonator made of composite material containing silicon and silicon oxide is nonnegligible, for example, larger than about 1.2 ppm/° C., except for ones that are specially compensated.

Regarding the frequency difference conditions of the resonator made of polysilicon, desired accuracy of the temperature sensor is smaller than ±0.059° C. for the frequency difference condition for identifying the carrier, is smaller than ±0.0182° C. for the frequency difference condition of image receiving, and is smaller than ±0.0054° C. for the error free frequency difference condition. The temperature sensor can hardly satisfy the temperature accuracy for the frequency difference condition of image receiving practically.

Exemplary Embodiment 3

The operation of receivers 119A, 119E, and 119F at the maximum frequency of 770 MHz in the UHF band (470 MHz to 770 MHz) as the signal band frequency used in the digital television broadcasting of the ISDB-T standard in Japan is described according to Embodiments 1 and 2. According to Embodiment 3, frequency fc of the received signal will be described. When frequency fc is lower than carrier frequency threshold fth, the predetermined frequency adjustment resolution can be often satisfied even when the accuracy of the temperature sensor is poor. A resonator that constitutes a reference oscillation unit is the MEMS resonator made of silicon.

The predetermined frequency adjustment resolution ratio according to formula 4 can be obtained from the following formula.

(Predetermined Frequency Adjustment Resolution Ratio)=(Predetermined Frequency Adjustment Resolution)/(Carrier Frequency $fc0$).

Here, formula 4 is rewritten with regard to frequency $fc0$ to provide the following formula.

$$fc0 \leq 1/(|\alpha| \times et \times 10^3) \quad (6)$$

Here, et is the temperature accuracy (the positive side) of the temperature sensor. Formula 6 is modified with regard to the predetermined frequency adjustment resolution of 1 kHz of the frequency difference condition for identifying the carrier. By substituting a in formula 6 with −30×10⁻⁶ (−30 ppm/° C.) and substituting accuracy et with "0.5", "0.2", and "0.05" of the temperature sensor, the accuracy of the temperature sensor as shown in FIG. 9C can be obtained. Although a part of the conditions shown in FIG. 9C can satisfy the band frequency of the ISDB-T standard, it is not possible to satisfy an entire band frequency.

Similarly, formula 4 is rewritten with regard to the frequency difference condition of image receiving and the error free frequency difference condition and calculating the maximum frequency of frequency fc to obtain the conditions of the temperature sensor shown in FIG. 9D. With the accuracy shown in FIG. 9D, it is difficult to satisfy the band frequency of the ISDB-T standard. As described above, the receivers 119A, 119E, and 119F according to Embodiments 1 and 2 can satisfy the frequency difference condition that cannot be obtained by the temperature compensation by the temperature sensor.

Exemplary Embodiment 4

Figure 11:
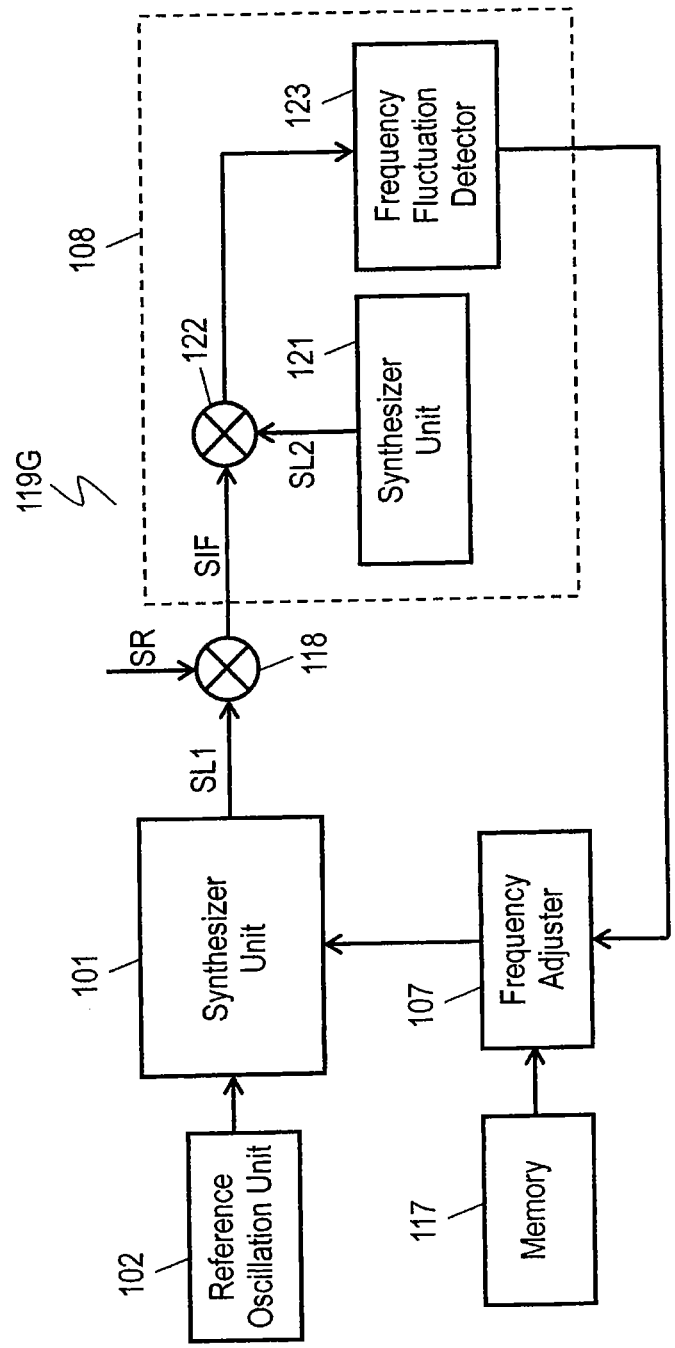
FIG. 11 is a block diagram of a synthesizer according to Exemplary Embodiment 4.

FIG. 11 is a block diagram of synthesizer 119G according to Exemplary Embodiment 4. In FIG. 11, components identical to those of synthesizer 119 shown in FIG. 1 are denoted by the same reference numerals, and their description will be omitted. Synthesizer 119G includes frequency fluctuation detector 108 of receiver 119A shown in FIG. 1 and further includes frequency fluctuation detector 123, synthesizer unit 121, and frequency converter 122. In the ISDB-T standard, received signal SR is converted into intermediate frequency (IF) signal SIF. According to the One-Segment broadcasting in the ISDB-T standard, the frequency of IF signal SIF is about 560 kHz. Frequency converter 122 multiplies IF signal SIF with local oscillation signal SL2 output from synthesizer unit 121, and converts the multiplied signal into the baseband signal as the digital signal having a component close to a direct current. Frequency fluctuation detector 123 detects a difference between frequency fc of received signal SR and frequency fL1 of local oscillation signal SL1.

Figure 12:
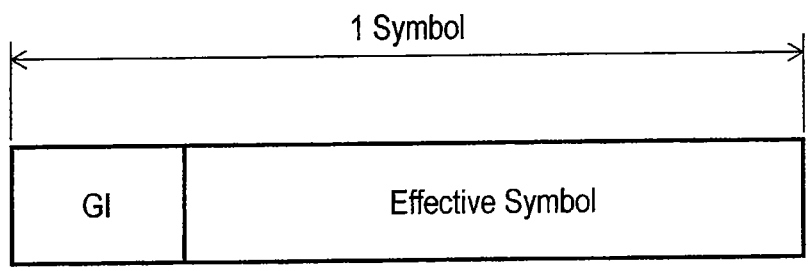
FIG. 12 illustrates a structure of a received signal of the synthesizer according to Embodiment 4.

Frequency fluctuation detector 123 executes processing to a predetermined known signal, thereby detecting the difference between frequency fc of received signal SR and frequency fL1 of local oscillation signal SL1. FIG. 12 illustrates a structure of a single symbol of a signal of the One-Segment broadcasting. The single symbol contains an effective symbol and a guard interval (GI). The effective symbol is an effective signal including data of an image. The guard interval is generated by copying a part of the effective symbol. Accordingly, by correlating the received signal with a signal generated by delaying the received signal by a predetermined period (for example, effective symbol period), a peak of the correlation for each period in which the guard interval is detected is output. The correlation between these two signals can be taken by convolution between the signals. In a digital signal processing, this can be realized by inverting an exclusive OR of each bit for of the two signals, and then by adding the two inverted signals. The guard interval of the signal transmitted from the broadcasting station is generated based on the reference oscillation signal generated in facilities of the broadcasting station. When the frequency of MEMS resonator 114 fluctuates largely according to the temperature, most of the fluctuation is caused by the frequency fluctuation due to the temperature of reference oscillation unit 102 ($\Delta ft \gg \Delta fc1$). Due to the correlation between the two signals, it is possible to detect the difference between frequency fc of received signal SR and frequency fL1 of local oscillation signal SL1 of synthesizer unit 101, and to detect the fluctuation of the oscillation frequency of resonator 114 due to the temperature. Upon supplying the detected fluctuation to frequency adjuster 107, frequency divider 106 is adjusted to compensate the frequency.

From a signal indicating the correlation with the signal that is orthogonally modulated, the frequency difference can be detected by the following method. In the case that received signal SR is an I-signal, correlation signal SRL1 indicating the correlation is generated by convolution between the I-signal and the I-signal delayed by a predetermined time. Correlation signal SRL2 indicating the correlation is generated by the convolution between the I signal and a Q-signal that is orthogonal to the I-signal. The frequency difference is detected based on a ratio between correlation signal SRL1 and correlation signal SRL2. Here, the term that the two signals are orthogonal means that a convolution value of the two signals is 0.

By the method described above, the frequency fluctuation that corresponds to the frequency interval in which a known signal appears can be detected. For example, according to the Mode 3 in the One-Segment broadcasting, the guard interval signal as the known signal allows the fluctuation up to 1 kHz to be detected. Further, it is possible to detect the fluctuation at an accuracy (±0.25%) and resolution lower than 0.5% of a fluctuation detection range of probable frequencies. In other words, the accuracy is not larger than 5 Hz. This accuracy corresponds to the frequency accuracy of ±0.0033 ppm (=±2.5 Hz/770 MHz) for the frequency of 770 MHz, and corresponds to the detection of the temperature with the accuracy of ±0.00011° C. for the silicon resonator having first order temperature coefficient $\alpha$ of −30 ppm/° C. Further, for the polysilicon resonator having first order temperature coefficient $\alpha$ of −22 ppm/° C., this accuracy corresponds to the detection of the temperature with the accuracy of ±0.00015° C. Such accuracy satisfies all of the frequency difference conditions for identifying the carrier, the frequency difference condition of image receiving, and the error free frequency difference condition.

In the above description, the method of detecting the narrowband frequency difference in order to detect the guard interval has been described. However, it is possible to detect the frequency based on another known signal of the guard interval.

Further, when the fluctuation larger than 1 kHz is produced, the frequency can be compensated by inserting a known signal in addition to the guard interval into the received signal. For example, if the detection of the frequency fluctuation of 215 kHz is desired, a known signal is inserted into the OFDM signal for every 215 kHz. In this case, instead of embedding a known signal in a single symbol as in the case of the guard interval, the symbol itself is regarded as the known signal (for example, the known signal configured by more than one symbol). In other words, a reference symbol as a reference is embedded in the received signal at an interval of a predetermined time and an interval of a predetermined frequency. Further, when detecting a wide frequency fluctuation range, both of the high detection accuracy and the wide detect fluctuation range can be realized by executing the detection along with the detection for the guard interval in a narrow fluctuation range.

According to this embodiment, the three frequency difference conditions are defined by the frequency difference value, and the synthesizer according to the embodiment directly detects the frequency difference. Accordingly, it is not necessary to improve the temperature accuracy along with the frequency temperature characteristic of resonator 114. In the example described above, regardless of temperature coefficient $\alpha$ of resonator 114, the frequency accuracy of ±2.5 Hz does not change. In order to realize the error free state in the One-Segment broadcasting, it is necessary to suppress the frequency accuracy to ±50 Hz. However, the synthesizer according to this embodiment can realize the predetermined frequency accuracy regardless of performances and types of resonator 114. It is preferable that the frequency can be finely adjusted by increasing the frequency adjustment resolution at frequency divider 106. Further, the frequency accuracy of ±2.5 Hz according to this embodiment is the frequency accuracy which is 1/20 of ±50 Hz, and sufficient performances can be obtained. The value of the frequency accuracy is not limited to ±2.5 Hz, and can be determined according to requirement of the system, and it is sufficient at least if ±50 Hz is satisfied for the error free frequency difference condition.

The synthesizer according to this embodiment provides the same effect, not only for the One-Segment broadcasting in the ISDB-T standard in Japan, but for the full-Segment broadcasting, such as stationary household-use televisions, and for the DVB-T and the DVB-H for oversea use, as well as for the mobile telephone systems. For example, in the case of the full-Segment broadcasting in the ISDB-T standard of the 64QAM system, the error free frequency difference condition ranges from ±20 Hz to ±30 Hz. As the frequency accuracy of ±2.5 Hz also falls within this range, the synthesizer according to this embodiment can be used in this type of system.

Frequency fluctuation detector 108 may be located in an integrated circuit (IC) including demodulator 120. In particular, the signal processing is realized by a digital circuit to provide the receiver with a small size.

Exemplary Embodiment 5

Figure 13:
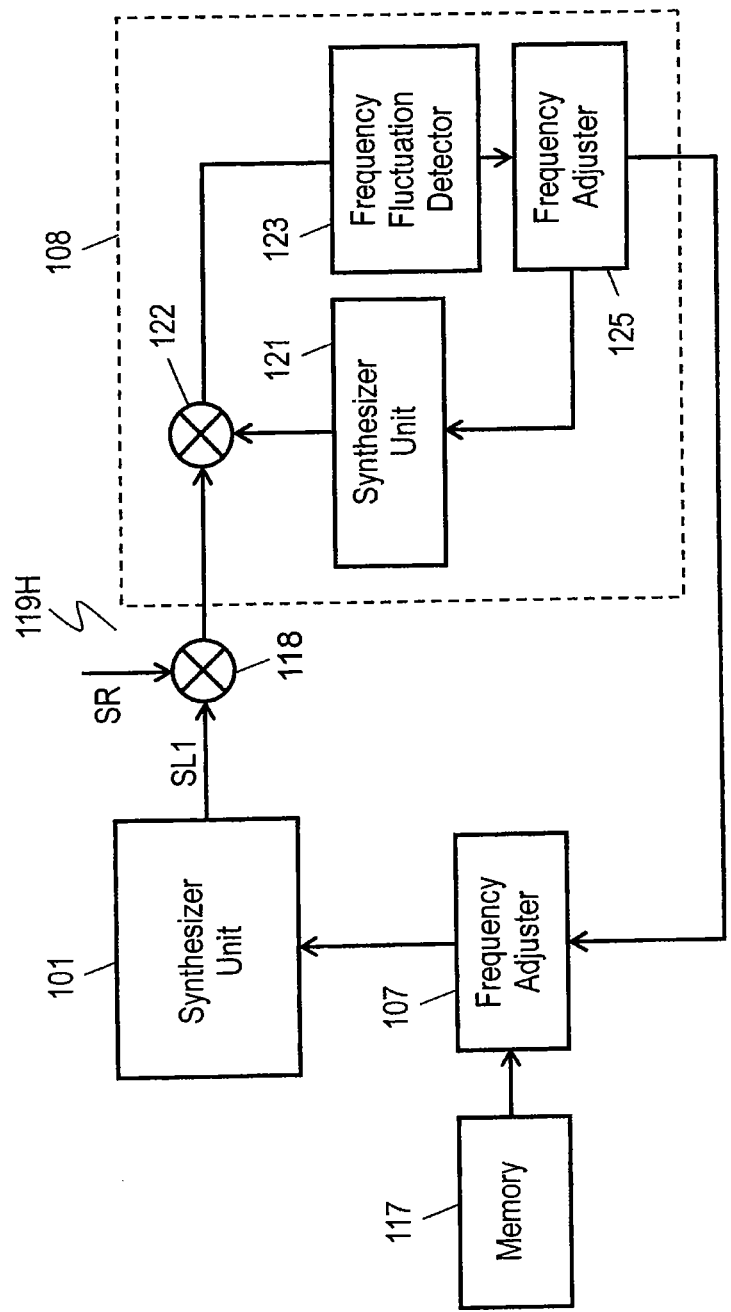
FIG. 13 is a block diagram of a synthesizer according to Exemplary Embodiment 5.

FIG. 13 is a block diagram of synthesizer 119H according to Exemplary Embodiment 5. In FIG. 13, components identical to those of synthesizer 119G according to Embodiment 4 shown in FIG. 11 are denoted by the same reference numerals, and their description will be omitted. Synthesizer 119H shown in FIG. 13 includes synthesizer 119G according to Embodiment 4 shown in FIG. 11 and further includes frequency adjuster 125. Frequency fluctuation detector 123 sends the detected frequency difference to frequency adjusters 107 and 125, and adjusts both of synthesizer units 101 and 121. This operation can reduce a wider frequency range to be adjusted by a single synthesizer unit than the synthesizer that adjusts only frequency adjuster 107, thereby reducing phase noises that are caused due to the frequency shift range for the frequency adjustment. In the case that the frequency is adjusted by frequency divider 106 of synthesizer unit 101, if the range of the frequency to be changed is too large, the phase noises of local oscillation signal SL1 increase and cause an adverse effect to the receiver.

Figure 14:
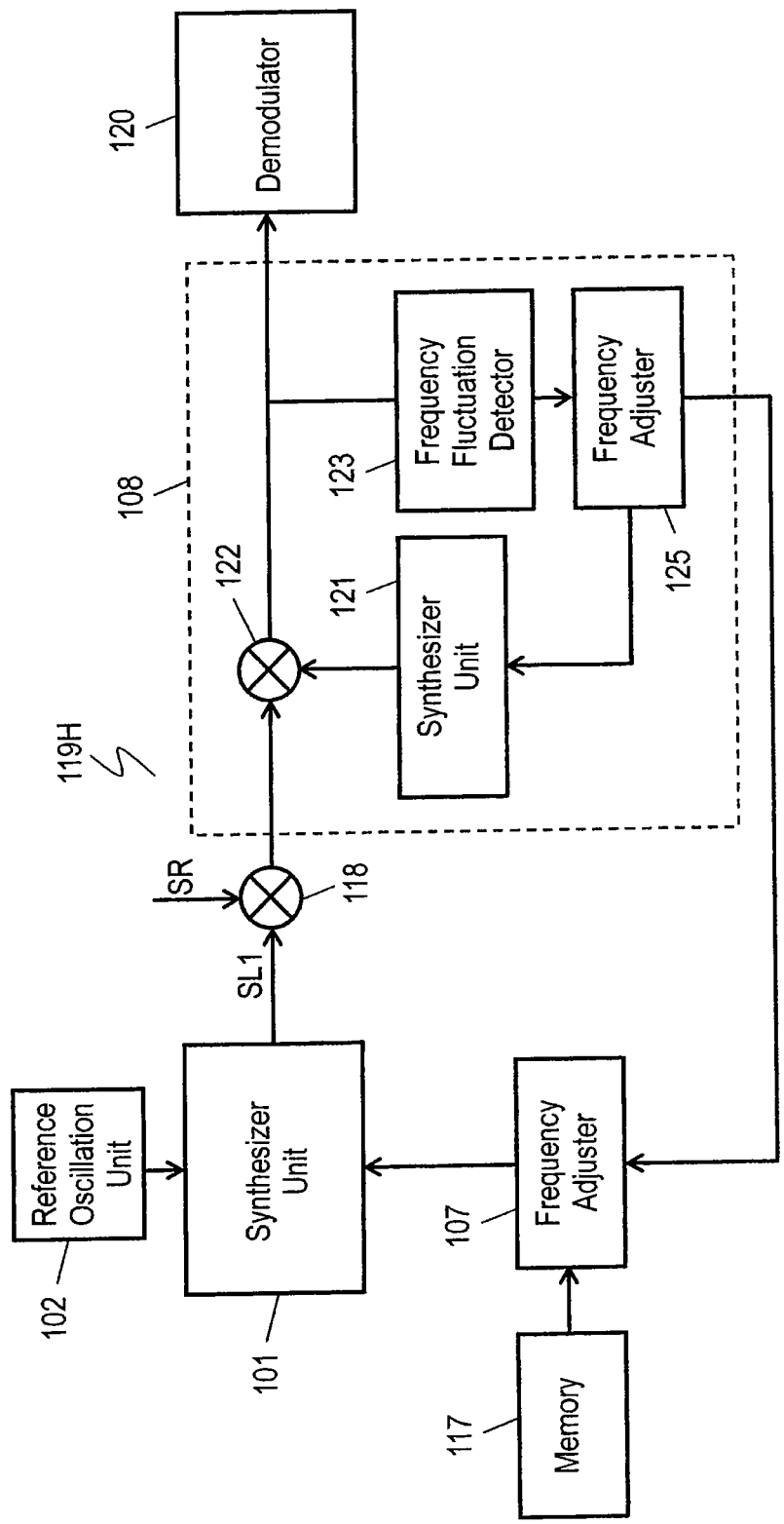
FIG. 14 is a block diagram of a receiver according to Embodiment 5.

FIG. 14 is a block diagram of receiver 119J including synthesizer 119H according to Embodiment 5. Receiver 119J includes synthesizer 119H and further includes demodulator 120 that demodulates the signal output from frequency converter 122. By monitoring the BER and the C/N ratio, it is possible to obtain the same effect as Embodiment 2. Synthesizer 119H according to Embodiment 5 may directly transmit an output of frequency fluctuation detector 123 to frequency adjuster 107.

Synthesizer unit 121 is implemented by a phase-locked loop (PLL) similarly to synthesizer unit 101. As long as the frequency can be output with a signal from frequency adjuster 125, synthesizer unit 121 may be implemented by a delay-locked loop (DLL) or a direct digital synthesizer (DDS) that does not form a loop. The DDS converts data of signals previously stored in the memory, for example, into an analog signal, and generates signals of various frequencies. Further, the frequency may be adjusted by directly connecting the frequency divider to an output of the oscillation unit. Moreover, a switch and plural capacitors may be connected as load capacitors of the reference oscillation unit, and, by activating the switch, the load capacitors may be discretely switched to adjust the frequency of the reference oscillation unit.

Exemplary Embodiment 6

Figure 15A:
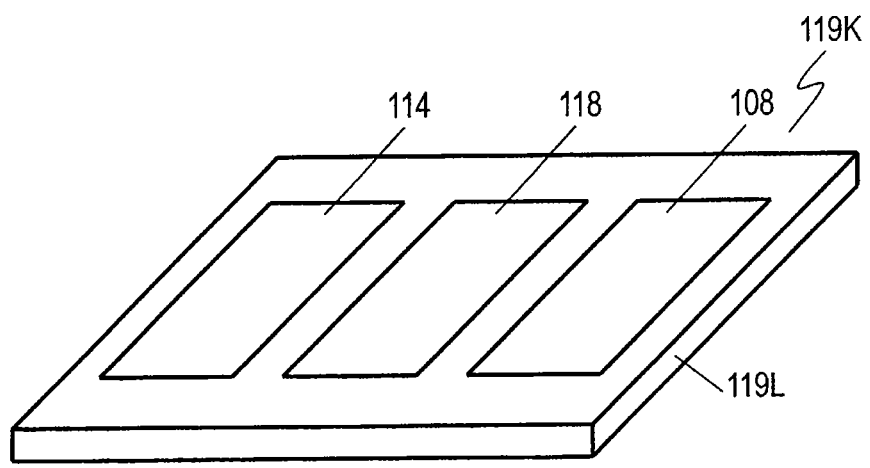
FIG. 15A is a perspective view of a receiver according to Exemplary Embodiment 6.

FIG. 15A is a perspective view of receiver 119K according to Exemplary Embodiment 6. Receiver 119K includes receiver 119J according to Embodiment 5 shown in FIG. 14 mounted on single semiconductor substrate 119L. For example, resonator 114 of reference oscillation unit 102, frequency converter 118, and frequency fluctuation detector 108 are formed integrally on single semiconductor substrate 119L. Frequency adjuster 107 is included in synthesizer unit 101 according to this embodiment, and also formed on semiconductor substrate 119L. Resonator 114 is made of silicon. As the resonator made of semiconductor, such as silicon, can be formed by a semiconductor fabrication process, such as a reactive ion etching (RIE), or by a photolithography process, it is possible to easily integrate such a resonator with other circuits. Further, in addition to the reducing of the size of resonator 114 itself by such a process, a space for wiring and mounting by the integration can be reduced, accordingly reducing the size of receiver 119K.

Exemplary Embodiment 7

Figure 15B:
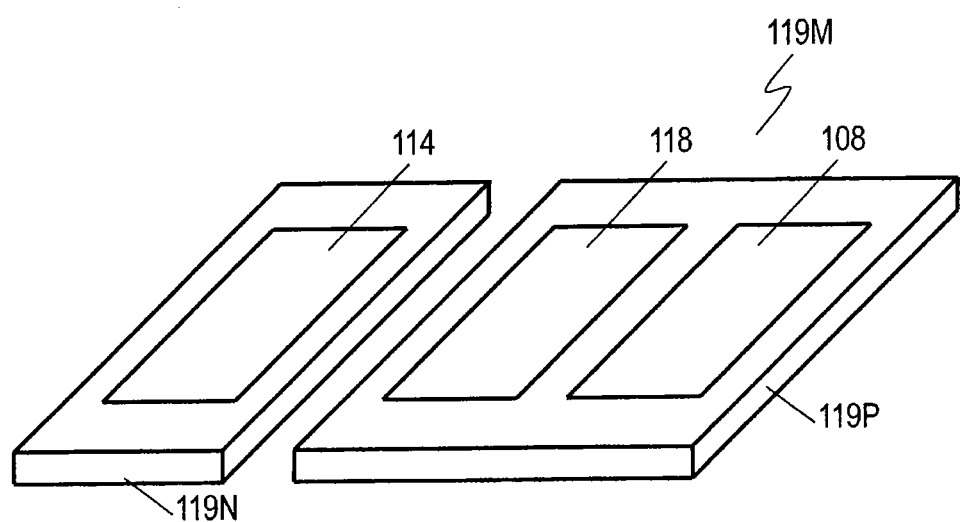
FIG. 15B is a perspective view of a receiver according to Exemplary Embodiment 7.

FIG. 15B is a perspective view of receiver 119M according to Exemplary Embodiment 7. Receiver 119M is configured such that receiver 119J according to Embodiment 5 shown in FIG. 14 is mounted on two semiconductor substrates 119N and 119P. For example, resonator 114 of reference oscillation unit 102 is formed on semiconductor substrate 119N. Frequency converter 118 and frequency fluctuation detector 108 are formed on semiconductor substrate 119P that is different from semiconductor substrate 119N.

An initial variation in the resonance frequency of resonator 114 is large. A yield rate when manufacturing receiver 119K according to Embodiment 6, in which resonator 114, frequency converter 118, and frequency fluctuation detector 108 are integrally formed on single semiconductor substrate 119L, is limited by a yield rate of resonator 114. By forming resonator 114 on separate semiconductor substrate 119N similarly to receiver 119M according to Embodiment 7, a preferable yield rate is maintained when manufacturing different semiconductor substrate 119P regardless of the yield rate of semiconductor substrate 119N.

In the case that synthesizer unit 101 and demodulator 120 are integrated on a single semiconductor IC, a process rule is set for demodulator 120 for further downsizing and cost-reduction, and 90 nm or 65 nm is employed, for example. The process rule of 90 nm or 65 nm represents a minimum dimension of a width that can be realized using the photolithography. Dimensions of a digital circuit become smaller according to the minimum dimension. However, dimensions of the MEMS resonator are determined based on the predetermined resonance frequency, and do not become smaller according to the minimum dimension. Accordingly, the effect of downsizing by reducing the process rule cannot be obtained with the MEMS resonator. Since the cost of the semiconductor IC per unit area increases as the minimum dimension of the process rule becomes smaller, it is often possible to further reduce the cost of synthesizer 119M by forming MEMS resonator 114 with which the effect of downsizing cannot be obtained on substrate 119N separately from synthesizer unit 101 and demodulator 120 and connecting externally to substrate 119P.

The receiver according to this embodiment does not necessarily include resonator 114 itself if the reference oscillation signal is supplied from another circuit.

In the synthesizer that compensates the frequency with the temperature sensor, a difference between the temperature to be detected and the temperature of the resonator becomes large when the temperature sensor is located away from the MEMS resonator. In this case, as the temperature accuracy of the temperature sensor is further affected by the difference between the temperatures, it becomes even more difficult to satisfy the frequency difference conditions. In the synthesizer according to this embodiment, frequency fluctuation detector 108 indirectly detects the temperature, and can detect the temperature accurately regardless of actual temperatures of MEMS resonator 114 and frequency fluctuation detector 108. Accordingly, MEMS resonator 114 is not necessarily integrated unitarily with frequency fluctuation detector 108, and can be located at any desired position.

Exemplary Embodiment 8

Figure 16:
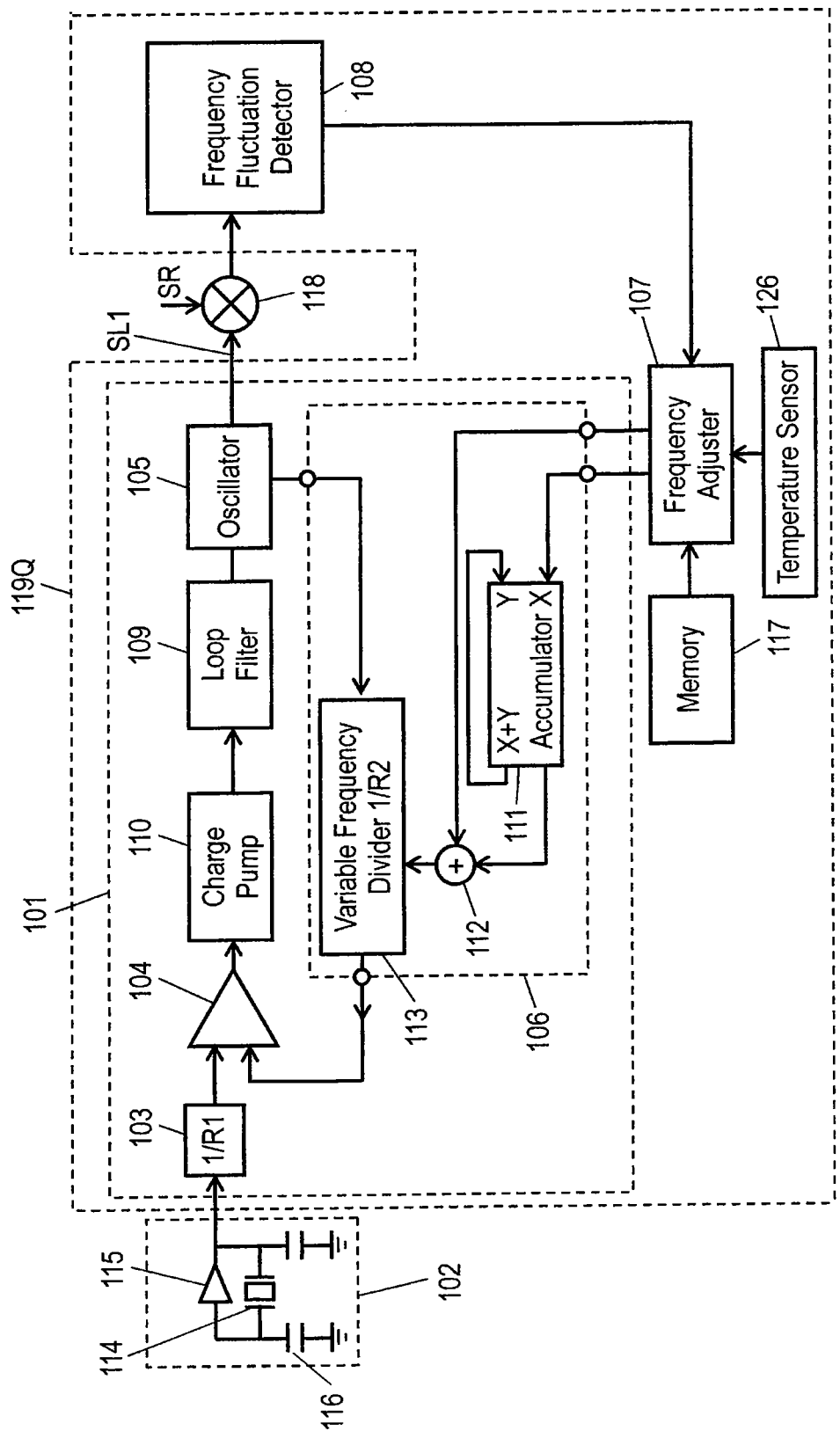
FIG. 16 is a block diagram of a synthesizer according to Exemplary Embodiment 8.

FIG. 16 is a block diagram of synthesizer 119Q according to exemplary Embodiment 8. In FIG. 16, components identical to those of synthesizer 119 according to Embodiment 1 shown in FIG. 1 are denoted by the same reference numerals, and their description will be omitted. Synthesizer 119Q includes synthesizer 119 shown in FIG. 1 and further includes temperature sensor 126. Temperature sensor 126 controls frequency adjuster 107 along with frequency fluctuation detector 108.

If the temperature changes largely, for example, at a speed higher than a few degree Celsius/sec, temperature sensor 126 controls frequency adjuster 107. When frequency fluctuation detector 108 detects the frequency fluctuation in the guard band, synchronization of signals in the baseband is required. In this case, it often takes a long time before synchronization is achieved due to a sharp temperature change. Before the synchronization is achieved, frequency adjuster 107 is controlled by the temperature detected by temperature sensor 126, and the frequency is roughly adjusted. Then after synchronization is achieved, frequency fluctuation detector 108 controls frequency adjuster 107 to adjust the frequency.

Such a large temperature change occurs when an operator moves outside the room, or gets out of a car, with a receiver for a mobile use such as a television for a mobile telephone, a laptop PC, or a mobile television. Further, such a large temperature change occurs when immediately after an air conditioner in the room is turned on. Moreover, a rapid temperature rise occurs immediately after the power is on in many cases for most electronic devices. The amount of the temperature change by the surrounding environment varies depending on a heat capacity of the receiver, and, in particular, the heat capacity of a small receiver such as a mobile telephone is small and its temperature changes more responsively to the environmental temperature. Synthesizer 119Q according to Embodiment 8 can quickly output a local oscillation signal of a stable frequency even when the temperature changes largely.

Exemplary Embodiment 9

Figure 17:
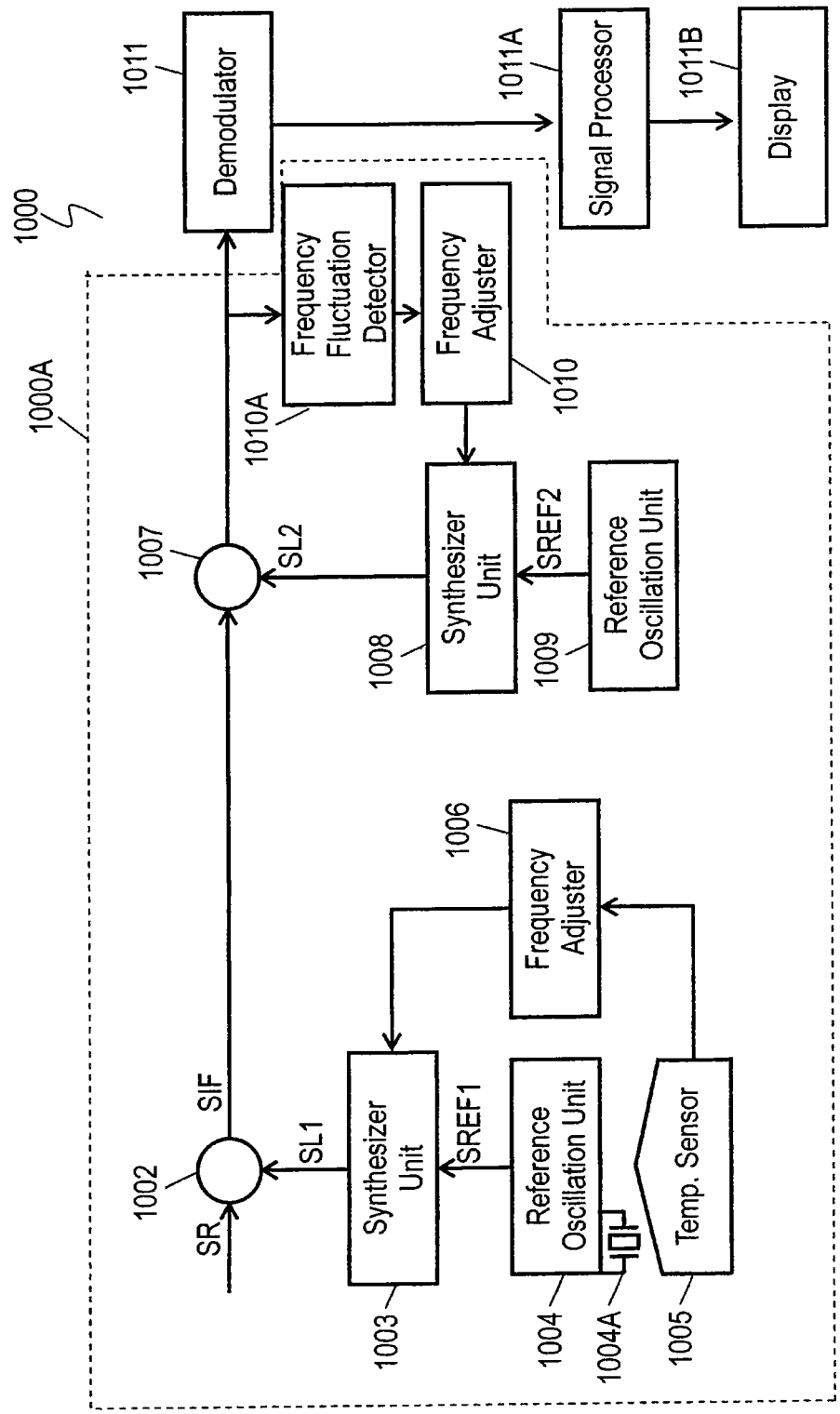
FIG. 17 is a block diagram of a receiver according to Exemplary Embodiment 9.

FIG. 17 is a block diagram of receiver 1000 including synthesizer 1000A according to Embodiment 9. Receiver 1000 includes reference oscillation unit 1004 that outputs reference oscillation signal SREF1, synthesizer unit 1003 that generates local oscillation signal SL1 based on reference oscillation signal SREF1, frequency converter 1002 that heterodynes received signal SR based on local oscillation signal SL1, temperature sensor 1005 that detects a temperature, frequency adjuster 1006 that adjusts frequency fL1 of local oscillation signal SL1 based on the temperature detected by temperature sensor 1005, reference oscillation unit 1009 that outputs reference oscillation signal SREF2, synthesizer unit 1008 that generates local oscillation signal SL2 based on reference oscillation signal SREF2, frequency converter 1007 that heterodynes a signal output from frequency converter 1002 based on local oscillation signal SL2, frequency fluctuation detector 1010A that detects a fluctuation of a frequency of a signal output by frequency converter 1007, frequency adjuster 1010 that adjusts frequency fL2 of local oscillation signal SL2 based on the detected fluctuation of the frequency, demodulator 1011 that demodulates the signal output by frequency converter 1007, signal processing unit 1011A that processes the demodulated signal, and display 1011B that displays the processed signal. Synthesizer 1000A includes synthesizer unit 1003, temperature sensor 1005, frequency adjuster 1006, synthesizer unit 1008, frequency fluctuation detector 1010A, and frequency adjuster 1010.

Synthesizer 1000A according to Embodiment 9 detects a temperature of reference oscillation unit 1004 using temperature sensor 1005 in addition to the temperature detection by frequency fluctuation detector 1010A, and compensates frequency fL1 of local oscillation signal SL1. It is possible to realize frequency temperature compensation control utilizing both of accurate temperature detection executed by frequency fluctuation detector 1010A and the temperature detection of a wide range by temperature sensor 1005.

An operation of frequency fluctuation detector 1010A and frequency adjuster 1010 will be described below. Receiver 1000 according to Embodiment 9 is a receiver for receiving digital broadcasting signals. Frequency fluctuation detector 1010A includes a wideband frequency difference calculation circuit and a narrowband frequency difference calculation circuit. The wideband frequency difference calculation circuit can calculate a frequency difference for each carrier interval based on the reference symbol for frequency synchronization inserted at a predetermined cycle by the broadcasting station. The orthogonal frequency division multiplexing (OFDM) is employed in the ISDB-T standard as a digital broadcasting system in Japan, and 1 cycle is about 1.4 MHz (=5.6 MHz/4) since there are four patterns of arrangement for frequency synchronization in its reception bandwidth of 5.6 MHz. Accordingly, frequency fluctuation detector 1010A compares an internally generated known signal to a known signal contained in the baseband signal output from frequency converter 1007, thereby detecting the frequency difference of ±700 kHz (=1.4 MHz/2). On the other hand, the narrowband frequency difference calculation circuit utilizes the guard interval contained in the signal of the OFDM. Since the guard interval is a duplication of a trailing part of the effective symbol, frequency difference within the carrier interval is detected based on correlation between the guard interval and the trailing part of the effective symbol. The narrowband frequency difference calculation circuit can detect the frequency difference within 1% of the carrier interval by appropriately setting a loop gain of a loop filter as an integrator included in frequency adjuster 1010. As the carrier interval is about 1 kHz in the Mode 3 of the ISDB-T standard, frequency fluctuation detector 1010A can detect the frequency difference at the resolution finer than 10 Hz. Frequency adjuster 1010 adds the frequency differences detected by the wideband frequency difference calculation circuit and the narrowband frequency difference calculation circuit to a set value of frequency fL2 of local oscillation signal SL2 of synthesizer unit 1008, thereby adjusting frequency fL2 of local oscillation signal SL2 to remove the frequency difference. As described above, frequency fluctuation detector 1010A and frequency adjuster 1010 can remove either the difference between the local oscillation signal of the broadcasting station and frequency fL2 of local oscillation signal SL1, or the frequency difference due to a transmission path.

Figure 18:
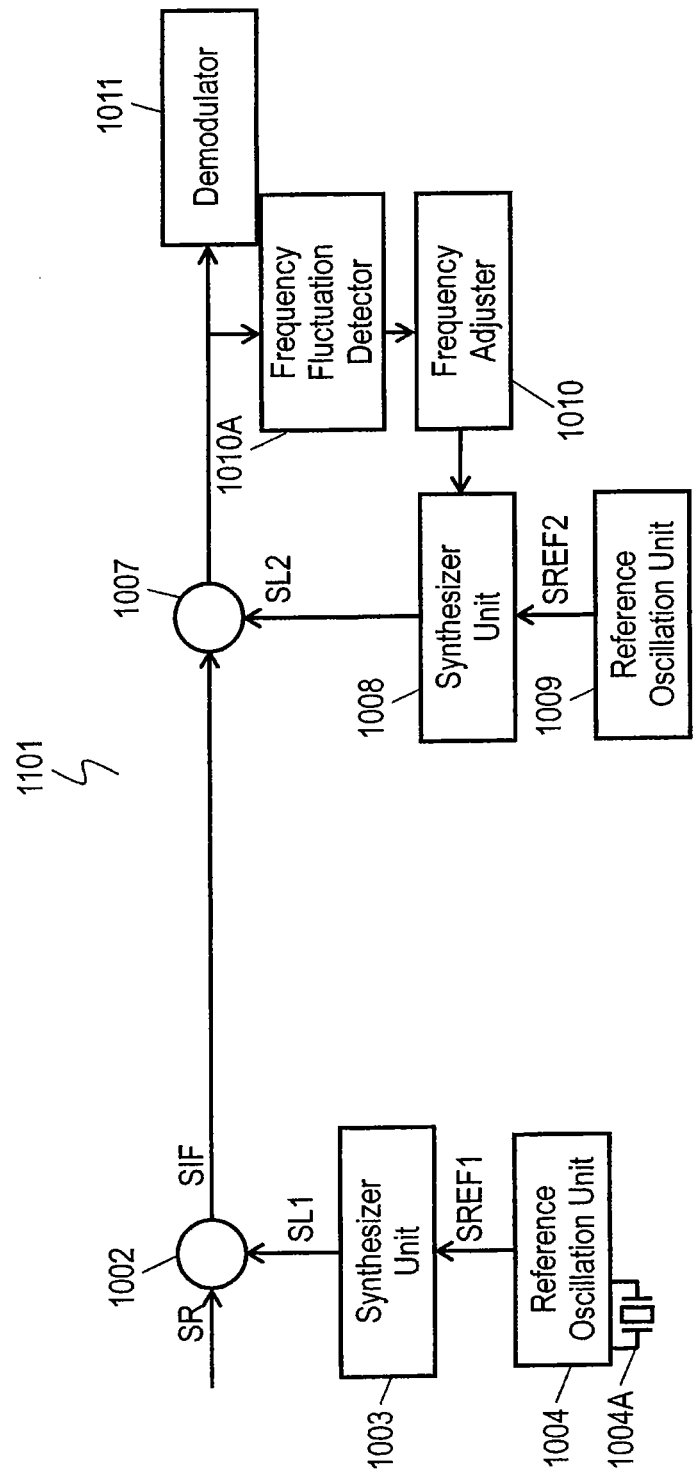
FIG. 18 is a block diagram of a comparative example of a receiver.

FIG. 18 is a block diagram of receiver 1101 as a comparative example. In FIG. 18, components identical to those of receiver 1000 shown in FIG. 17 are denoted by the same reference numerals, and their description will be omitted. Receiver 1101 does not include the temperature sensor or frequency adjuster 1006 of receiver 1000. Reference oscillation unit 1004 employs a crystal resonator. The frequency fluctuation range of the crystal resonator is maximum ±30 ppm in the temperature range of use of the receiver from −40° C. to +85° C. Since the UHF band (470 MHz to 770 MHz) is used in the digital broadcasting, when the frequency of intermediate frequency signal SIF output from frequency converter 1002 is 57 MHz, frequency fL1 of local oscillation signal SL1 is 713 MHz (=770-57) at a maximum. Accordingly, the fluctuation range within the temperature range of use is about ±21 kHz (=713 MHz×30×10$^{-6}$) at a maximum. Since the frequency of intermediate frequency (IF) signal SIF is a difference between the frequency of received signal SR and frequency fL1 of local oscillation signal SL1, the fluctuation range of the IF signal is also about ±21 kHz. Since the fluctuation range is sufficiently smaller than ±700 kHz as an adjustment range of frequency adjuster 1010, frequency adjuster 1010 can compensate the fluctuation range. In receiver 1000 according to Embodiment 9, reference oscillation unit 1004 generates reference oscillation signal SREF1 using MEMS resonator 1004A made of silicon manufactured by the MEMS technology. Since the oscillation frequency of MEMS resonator 1004A fluctuates at the fluctuation rate of about −30 ppm/° C., frequency fREF1 of reference oscillation signal SREF1 fluctuates within the fluctuation range of 3750 ppm in the temperature range from −40° C. to +85° C. This fluctuation causes the fluctuation range of frequency fL1 of local oscillation signal SL1 to be about 2674 kHz (=713

MHz×3750×10⁻⁶), and the fluctuation range of the frequency of intermediate frequency signal SIF also becomes about 2674 kHz. Since the fluctuation range exceeds the adjustment range of frequency adjuster 1010, frequency converter 1007 cannot adjust the frequency difference. Then, demodulator 1011 cannot synchronize the frequency, and cannot demodulate the baseband signal output from frequency converter 1007. While MEMS resonator 1004A is small and inexpensive and has been put to practical use in the field such as clocks for digital circuits, the above problems have become apparent in the study of application to high frequency wave receivers, such as receivers for the digital broadcasting.

Figure 19:
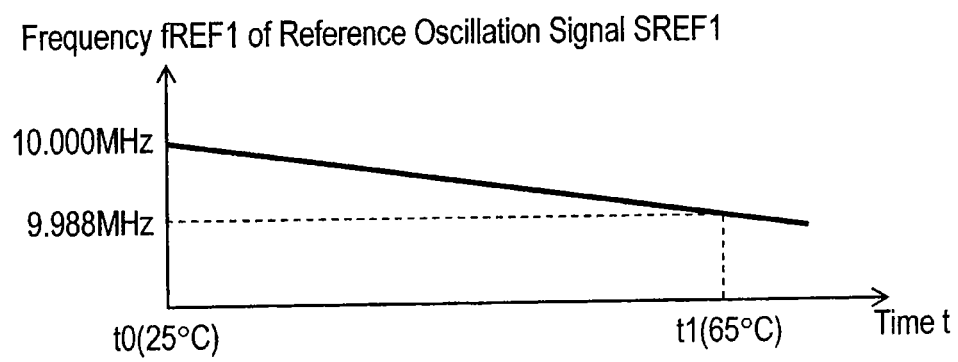
FIG. 19 is shows a frequency of a reference oscillation signal of the comparative example of the receiver.
Figure 20:
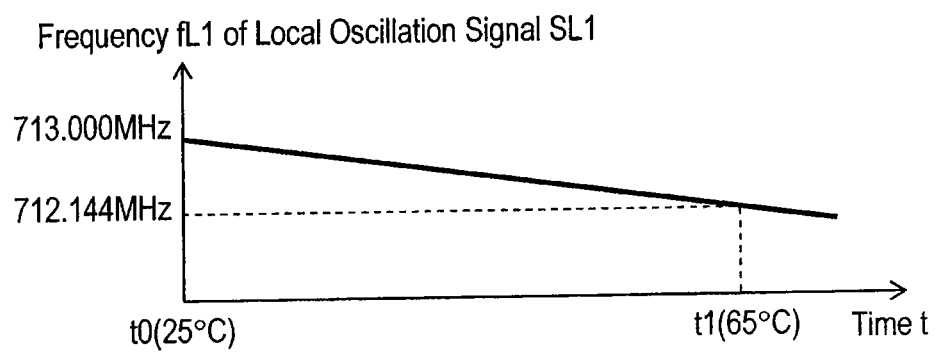
FIG. 20 shows a frequency of a local oscillation signal of the comparative example of the receiver.
Figure 21:
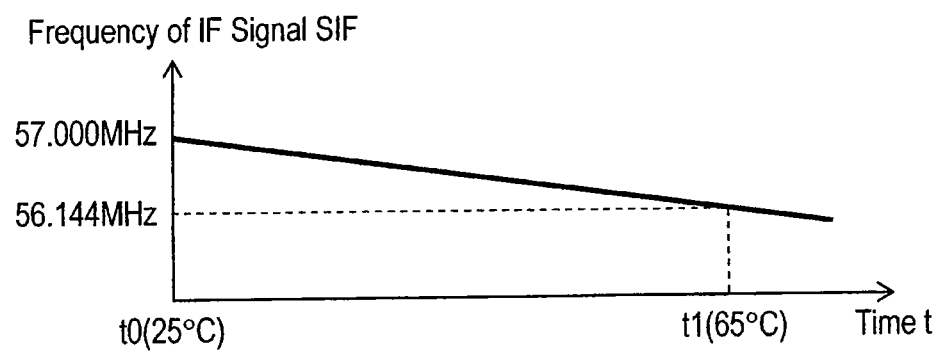
FIG. 21 shows a frequency of an intermediate frequency (IF) signal of the comparative example of the receiver.
Figure 22:
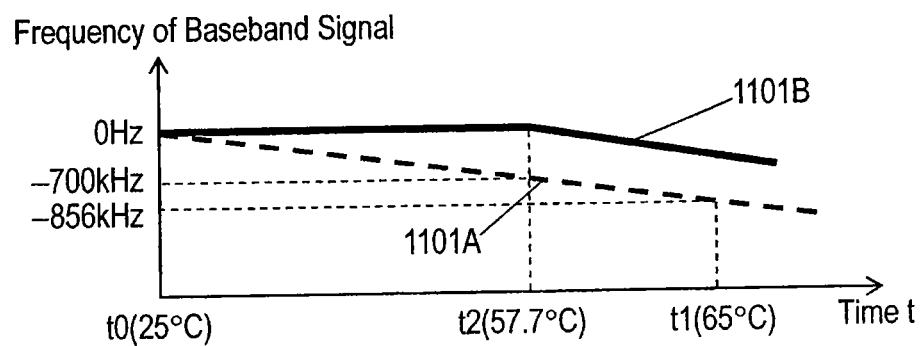
FIG. 22 shows a frequency of a baseband signal of the comparative example of the receiver.

FIG. 19 shows a fluctuation of frequency fREF1 of reference oscillation signal SREF1 output from reference oscillation unit 1004. In FIG. 19, the horizontal axis represents time, and the vertical axis represents frequencies. The frequency of received signal SR is 770 MHz. As shown in FIG. 19, a temperature at time t0 is 25° C., and then the temperature rises linearly with respect to time t up to 65° C. at time t1. MEMS resonator 1004A made of silicon has a temperature coefficient of −30 ppm/° C. If frequency fREF1 of reference oscillation signal SREF1 of reference oscillation unit 1004 including MEMS resonator 1004A is 10 MHz at 25° C., frequency fREF1 fluctuates by −1200 ppm (=−30 ppm×(65-25)) and becomes 9.988 MHz by the temperature rising up to 65° C. FIG. 20 shows a fluctuation of frequency fL1 of local oscillation signal SL1. When the frequency of intermediate frequency signal SIF is 57 MHz, frequency fL1 of local oscillation signal SL1 at time t0 at which the temperature is 25° C. is set to 713 MHz. Due to the fluctuation of frequency fREF1 of reference oscillation signal SREF1, frequency fL1 falls down to 712.144 MHz at the temperature of 65° C. FIG. 21 shows a fluctuation of the frequency of IF signal SIF. The frequency of IF signal SIF at time t0 at which the temperature is 25° C. is 57 MHz. Since the fluctuation (856 kHz) of frequency fL1 of local oscillation signal SL1 becomes the fluctuation of the frequency of IF signal SIF as it is, the frequency falls down to 56.144 MHz at 65° C. FIG. 22 shows a fluctuation of the frequency of the baseband signal of receiver 1101 as the comparative example. Frequency fL2 of local oscillation signal SL2 output from synthesizer unit 1008 is set to 57 MHz identical to that of IF signal SIF. Frequency converter 1007 converts intermediate frequency signal SIF into the baseband signal. In FIG. 22, profile 1101A represents the frequency of the baseband signal when frequency adjuster 1010 does not operate. Profile 1101A indicates that the frequency of the baseband signal at time t0 at which the temperature is 25° C. is 0 Hz, but falls down to −856 Hz at a temperature of 65° C. In FIG. 22, profile 1101B shows a frequency of the baseband signal when frequency adjuster 1010 operates. Since frequency adjuster 1010 can adjust frequency fL2 of the local oscillation signal to ±700 kHz, the frequency of the baseband signal can be set to 0 Hz by adjusting frequency fL2 at the temperature from 25° C. to 57.7° C. before the frequency difference of the baseband signal becomes −700 kHz. However, since the frequency difference of the baseband signal exceeds the adjustment range of frequency adjuster 1010 at the temperature not lower than 57.7° C., the frequency of the baseband signal falls along the same slope as profile 1101A when frequency adjuster 1010 does not operate. In this state, demodulator 1011 cannot synchronize the frequency and cannot demodulate the baseband signal. At the temperature not lower than 57.7° C., receiver 1101 cannot receive signal SR. Similarly, when the temperature falls from 25° C., frequency adjuster 1010 does not operate at a temperature lower than −7.7° C. As described above, in receiver 1101 as the comparative example, if reference oscillation unit 1004 generates reference oscillation signal SREF1 using MEMS resonator 1004A made of silicon, receiver 1101 can receive received signal SR only in the temperature range from −7.7° C. to +57.7° C., and thus, cannot cover an entire temperature range of use (from −40° C. to +85° C.).

Figure 23:
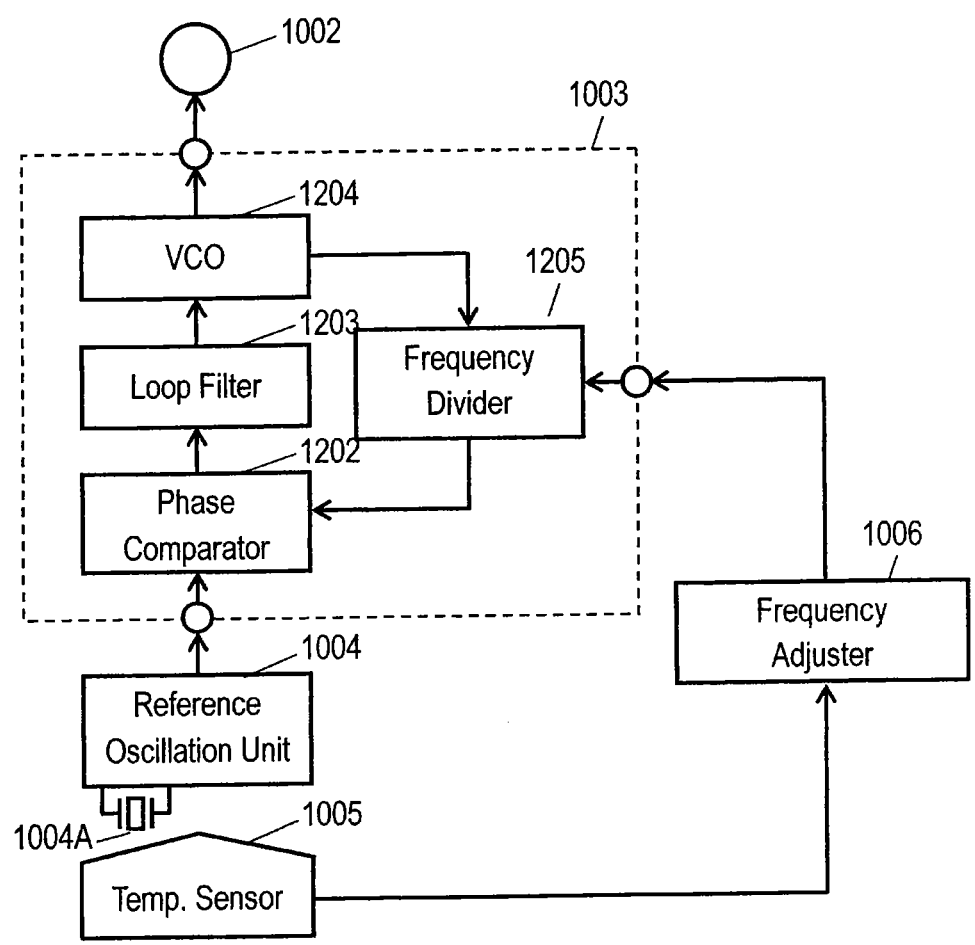
FIG. 23 is a block diagram of a synthesizer unit according to Embodiment 9.

Receiver 1000 according to Embodiment 9 compensates the change of frequency fREF1 of reference oscillation signal SREF1 due to the temperature change by adjusting frequency fL1 of local oscillation signal SL1 based on the temperature detected by temperature sensor 1005. FIG. 23 is a block diagram of synthesizer unit 1003 of receiver 1000. Synthesizer unit 1003 includes voltage-controlled oscillator (VCO) 1204 that generates local oscillation signal SL1, phase comparator 1202 that outputs a signal according to a phase difference between reference oscillation signal SREF1 and a comparison signal, loop filter 1203 that outputs a signal of a low frequency component of the signal output from phase comparator 1202, frequency divider 1205 that frequency-divides local oscillation signal SL1 and outputs the comparison signal, thus constituting a phase-locked loop (PLL). The signal output from phase comparator 1202 has a pulse width proportional to a phase difference between reference oscillation signal SREF1 and the comparison signal. Frequency divider 1205 divides the frequency of local oscillation signal SL1 by frequency dividing ratio M set by frequency adjuster 1006, and outputs the comparison signal having frequency fREF1/M. VCO 1204 determines frequency fL1 based on the signal output from loop filter 1203. The PLL operates such that a voltage output from loop filter 1203 is converged such that frequency fL1/M becomes identical to frequency fREF1. Accordingly, frequency fL1 of local oscillation signal SL1 is expressed by formula 7.

$$fL1 = fREF1 \times M \qquad (7)$$

Frequency adjuster 1006 controls frequency dividing ratio M of frequency divider 1205 to allow synthesizer unit 1003 to output local oscillation signal SL1 having desired frequency fL1. Frequency divider 1205 can divide the frequency by a fractional frequency dividing ratio by utilizing a fractional-N method or a delta-sigma method, thereby dramatically raising a resolution to set frequency fL1.

In order to set frequency fL1 of local oscillation signal SL1 to 713 MHz when reference oscillation signal SREF1 is 10 MHz, frequency adjuster 1006 sets frequency dividing ratio M of frequency divider 1205 to 71.3.

In the case that reference oscillation unit 1004 includes MEMS resonator 1004A made of silicon, frequency fREF1 of reference oscillation signal SREF1 fluctuates largely according to the fluctuation of the temperature. Temperature sensor 1005 can detect an ambient temperature of reference oscillation unit 1004, particularly, of MEMS resonator 1004A. Frequency adjuster 1006 can control frequency dividing ratio M of frequency divider 1205 based on the detected temperature, and maintain frequency fL1 at a constant value. An operation of receiver 1000 will be described below for the case that frequency fREF1 of reference oscillation signal SREF1 output from reference oscillation unit 1004 including MEMS resonator 1004A made of silicon is 10 MHz at the temperature of 25° C., and frequency fL1 of local oscillation signal SL1 output from synthesizer unit 1003 is 713 MHz. When the temperature of MEMS resonator 1004A is 25° C., as described above, frequency adjuster 1006 sets frequency dividing ratio M of frequency divider 1205 to 71.3. Since first order temperature coefficient α of resonator 1004A is −30 ppm/° C., when the temperature of MEMS resonator 1004A is 30° C., frequency fREF1 becomes 9.9985 MHz (=10 MHz+10 MHz×(−30 ppm/° C.)×5° C.). Accordingly, frequency adjuster 1006 sets frequency dividing ratio M of frequency divider 1205 to 71.3107 MHz (=713 MHz/9.9985). As described above, frequency adjuster 1006 can control frequency dividing ratio M of frequency divider 1205 based on the detected temperature of temperature sensor 1005, and maintain frequency fL1 at a constant value. Frequency adjuster 1006 calculates frequency dividing ratio M for obtaining frequency fL1 based on the temperature detected by temperature sensor 1005 and temperature coefficient α of resonator 1004A. Alternatively, frequency adjuster 1006 can store plural values of the temperature and plural values of frequency dividing ratio M that respectively correspond to the plural values of the temperature, and can set frequency dividing ratio M that corresponds to the detected temperature value.

Frequency adjuster 1006 can adjust fL1 over a frequency variable range (from several hundreds MHz to several GHz) of VCO 1204 by controlling frequency dividing ratio M of frequency divider 1205. Temperature sensor 1005 which can employ a semiconductor-based temperature sensor and a thermistor has a temperature-detectable range sufficiently wider than the temperature range of use (from −40° C. to +85° C.). Specifically, while the adjustment range by frequency adjuster 1010 is ±700 kHz, frequency adjuster 1006 can sufficiently adjust a range (about 2674 kHz) of frequency fL1 of local oscillation signal SL1 changing due to the temperature characteristic of MEMS resonator 1004A made of silicon.

Frequency adjuster 1010 can adjust the frequency difference generated due to the frequency difference between the local oscillation signal of the broadcasting station and local oscillation signal SL1, or due to the transmission path. Since frequency adjuster 1006 adjusts frequency fL1 based only on the ambient temperature of MEMS resonator 1004A, frequency adjuster 1006 cannot accurately adjust frequency fL1 when the local oscillation signal of the broadcasting station includes an offset or when an offset is generated in the frequency of the received signal due to the transmission path. In receiver 1000 according to Embodiment 9, frequency adjuster 1006 adjusts a wide range of change of frequency fL1 of local oscillation signal SL1 due to the temperature characteristic of MEMS resonator 1004A, and frequency adjuster 1010 adjusts a deviation of frequency fL1 due to the offset of the local oscillation signal of the broadcasting station and the offset due to the transmission path.

Receiver 1000 according to Embodiment 9 can adjust the difference of frequency fL1 of local oscillation signal SL1 even while frequency synchronization is not established. Specifically, if frequency fluctuation detector 1010A cannot detect the reference symbol and the frequency synchronization cannot be established when the level of received signal SR is low, or when the frequency synchronization is not established as being immediately after a channel is selected, frequency adjuster 1010 cannot adjust the difference of frequency fL1 of local oscillation signal SL1. However, even in these cases, frequency adjuster 1006 can always adjust the frequency fL1 based on the temperature detected by temperature sensor 1005 regardless of the establishment of the frequency synchronization.

Receiver 1000 according to Embodiment 9 also provides an advantageous effect of capable of responding to the temperature change in a short time. Frequency adjuster 1010 has a response speed of several hundred milliseconds, and can have the frequency difference of 0.4 times the carrier interval converge in a period corresponding to about 250 symbols, for example. In the ISDB-T standard, the carrier interval is about 1 kHz, and a single symbol period is about 1 millisecond. Accordingly, frequency adjuster 1010 can have the frequency difference of about 400 Hz converge in about 250 milliseconds, and has a frequency adjustment speed of 1.6 kHz/second (=400 Hz/0.25 second). Accordingly, it is not possible to follow the fluctuation when frequency fREF1 of reference oscillation signal SREF1 output from reference oscillation unit 1004 including MEMS resonator 1004A fluctuates at a speed exceeding 2.24 ppm/second (=1.6 kHz/713 MHz). Therefore, if the temperature of MEMS resonator 1004A changes at 0.075° C./second (=2.24/30) or faster, the receiving quality deteriorates. On the other hand, as a temperature detection speed of temperature sensor 1005 is sufficiently faster than a converging speed of frequency adjuster 1010, frequency adjuster 1006 adjusts frequency fL1 sufficiently fast so as to adjust the frequency difference of local oscillation signal SL1 for the temperature change even exceeding 0.075° C./second.

Temperature sensor 1005 can employ thermistors or semiconductor-based sensors that have the temperature characteristics of the current that flows through them. The temperature can be indirectly detected based on a difference between frequencies of two resonators having different temperature characteristics. Alternatively, comparison or multiplication with a difference from a signal having another clock or frequency allows the difference to be detected so as to detect a deviation of frequency fREF1 of reference oscillation signal SREF1 due to the temperature. Such a clock can employ received signal SR itself as a desired signal, a signal used for Global Positioning System (GPS), or a signal supplied from a different circuit block of the receiver. As described above, temperature sensor 1005 can be implemented by a device that directly or indirectly detects the temperature.

Receiver 1000 includes reference oscillation unit 1004, however, may include an input terminal that inputs reference oscillation signal SREF1 from a reference oscillation unit outside receiver 1000. This configuration allows receiver 1000 to share the reference oscillation unit with other circuits.

Receiver 1000 generates local oscillation signal SL2 based on reference oscillation signal SREF2 output from reference oscillation unit 1009. Reference oscillation unit 1009 may also include a MEMS resonator made of semiconductor, such as silicon. Receiver 1000 may not include reference oscillation unit 1009, and may generate local oscillation signal SL2 based on reference oscillation signal SREF1 output from reference oscillation unit 1004. This configuration reduces a cost and a size of receiver 1000. In this case, frequency fL2 of local oscillation signal SL2 also fluctuates due to the temperature characteristic of the MEMS resonator. When frequency fL2 of local oscillation signal SL2 is low, the fluctuation range of frequency fL2 is within the adjustment range of frequency adjuster 1010, and therefore frequency adjuster 1010 can correctly adjust frequency fL2. While the local oscillator frequency fluctuates within the fluctuation range of about 2674 kHz, when the frequency of intermediate frequency signal SIF is 57 MHz, the fluctuation range in which frequency fL2 of local oscillation signal SL2 fluctuates within the temperature range of use is about 214 kHz (=57 MHz×3750×10$^{-6}$).

Frequency converter 1002 heterodynes received signal SR. Receiver 1000 may further include another circuit which is connected to a previous stage of frequency converter 1002 and which processes received signal SR. Receiver 1000 may further include another circuit connected between frequency converters 1002 and 1007.

Frequency adjuster 1010 may adjust frequency fL1 of local oscillation signal SL1 based on the signal output from frequency converter 1007. Frequency adjuster 1006 may also adjust frequency fL2 of local oscillation signal SL2 based on the temperature detected by temperature sensor 1005.

Frequency adjuster 1006 may adjust frequency fL1 of local oscillation signal SL1 based on a rate of change to time of the temperature detected by temperature sensor 1005. For example, frequency adjuster 1006 that increases or decreases dividing ratio M of frequency divider 1205 by a predetermined width repetitively at a predetermined period based on the rate of the change to time of the temperature so as to cancel a changing rate of the frequency of reference oscillation signal SREF1 by a control speed of dividing ratio M, and to suppress time fluctuation of frequency fL1 of local oscillation signal SL1. Similarly, frequency adjuster 1010 may adjust frequencies fL1 and fL2 of local oscillation signals SL1 and SL2 based on a rate of the change to time of the frequency output from frequency converter 1007.

Receiver 1000 receives the digital broadcasting signal, but may receive signals of mobile telephones and a wireless LAN. Frequencies of the signals from the mobile telephones and the wireless LAN are about 2.4 GHz and about 1.8 GHz, respectively, which is higher than that of the digital broadcasting. When received signal SR has such a high frequency, the fluctuation of frequency fL1 of local oscillation signal SL1 due to the fluctuation of frequency fREF1 of reference oscillation signal SREF1 further increases. Accordingly, if reference oscillation unit 1004 is configured by MEMS resonator 1004A, frequency fL1 can hardly be only with frequency adjuster 1110, and therefore frequency fL1 can be adjusted by both of frequency adjusters 1006 and 1110.

Exemplary Embodiment 10

Figure 24:
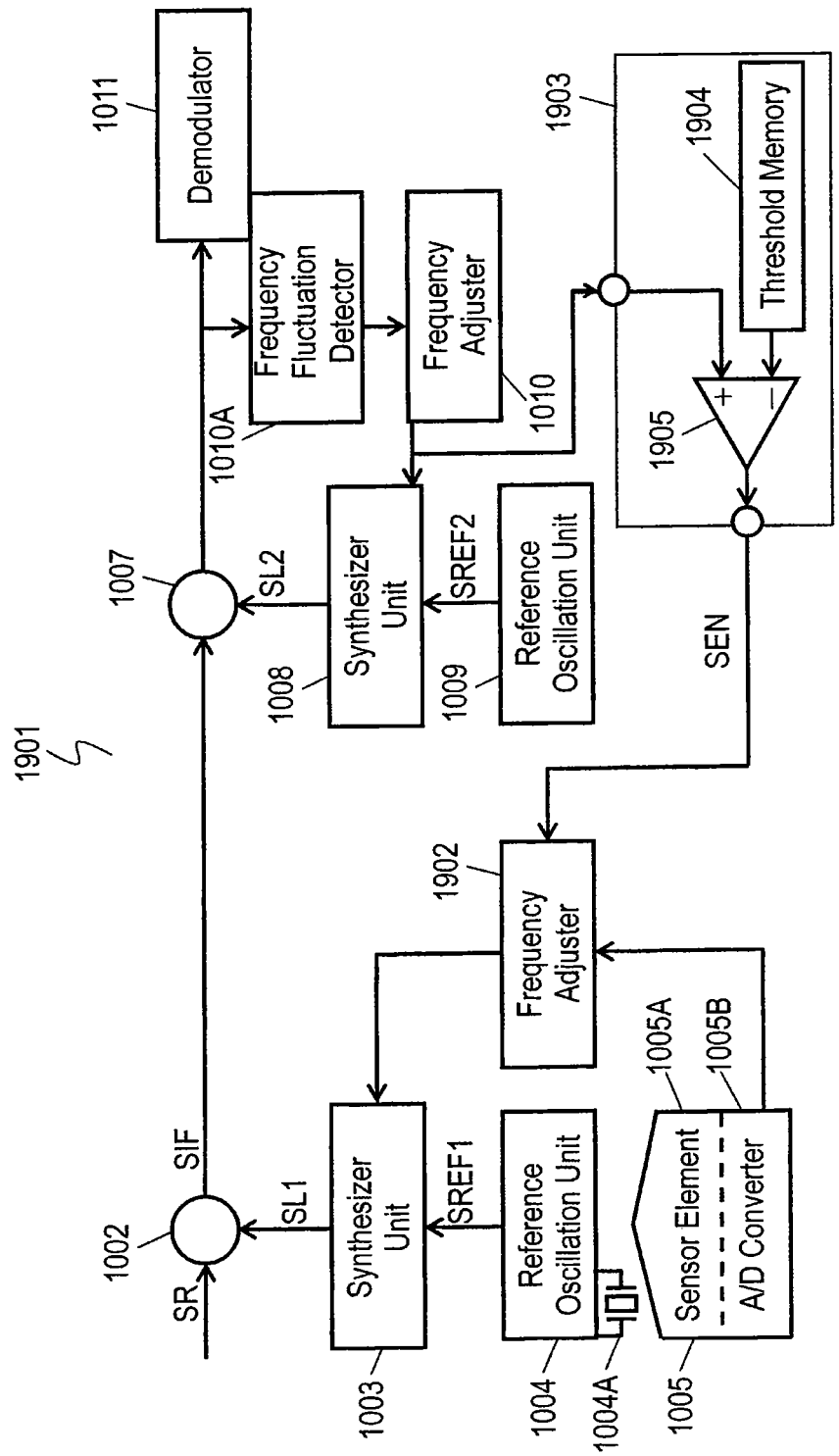
FIG. 24 is a block diagram of a receiver according to Exemplary Embodiment 10.

FIG. 24 is a block diagram of receiver 1901 according to Exemplary Embodiment 10. In FIG. 24, components identical to those of receiver 1000 according to Embodiment 9 shown in FIG. 17 are denoted by the same reference numerals, and their description will be omitted. Receiver 1901 includes frequency adjuster 1902 instead of frequency adjuster 1006 of receiver 1000 shown in FIG. 17, and further includes controller 1903.

Controller 1903 outputs enable signal SEN based on an amount of a frequency adjusted by frequency adjuster 1010. Frequency adjuster 1902 is switched between to be activated and to be deactivated based on enable signal SEN. Controller 1903 includes threshold memory 1904 that stores a threshold, and comparator 1905 that compares the amount of the adjusted frequency to a threshold, and outputs enable signal SEN. Receiver 1901 can adjust frequency fL1 stably.

Similarly to frequency adjuster 1006 of receiver 1000 according to Embodiment 9, frequency adjuster 1902 can adjust frequency fL1 of local oscillation signal SL1 based on the temperature detected by temperature sensor 1005, and can adjust frequency fL1 over the fluctuation range of frequency fL1 due to the temperature characteristic of MEMS resonator 1004A. However, frequency adjuster 1902 may produce a problem that is not produced by frequency adjuster 1110. This problem is caused by the detection resolution of temperature sensor 1005, and will be described below. Temperature sensor 1005 includes sensor device 1005A that outputs an analog signal, such as a voltage, corresponding to the detected temperature, and analog/digital (A/D) converter 1005B that converts the analog signal into a digital signal. Temperature sensor 1005 includes A/D converter 1005B regardless of the types of sensor device 1005A, such as semiconductor-based ones or thermistor. A quantization noise of A/D converter 1005B causes the detection resolution of the temperature to be at least ±0.1° C. The resolution of frequency adjustment of frequency adjuster 1902 depends upon this detection resolution. Specifically, since temperature coefficient α of MEMS resonator 1004A made of silicon is −30 ppm/° C., when the detection resolution of temperature sensor 1005 is 0.1° C., the resolution of frequency adjustment of frequency adjuster 1902 becomes 3 ppm (=30 ppm/° C.×0.1° C.). Accordingly, when frequency fL1 of local oscillation signal SL1 is 713 MHz, the resolution of frequency adjustment of frequency adjuster 1902 becomes 2.14 kHz, which is a minimum width by which frequency fL1 is adjusted. Depending on the method of modulation/demodulation, this width may cause an adverse effect to the demodulation of demodulator 1011. For example, the carriers that configure the OFDM signal in the ISDB-T standard are arranged at an interval of about 1 kHz. When the frequency of the signal output from synthesizer unit 1003 fluctuates by 2.14 kHz, the frequency of the baseband signal fluctuates by a width of two or more carriers, and adversely affects the frequency synchronization of demodulator 1011, thereby deteriorating the receiving quality.

Figure 25:
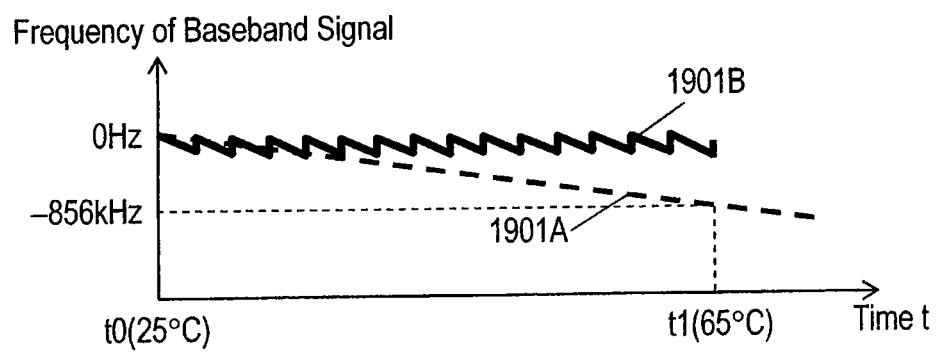
FIG. 25 shows a frequency of a baseband signal of a comparative example of a receiver.

FIG. 25 shows a fluctuation of the frequency of the baseband signal when the temperature of MEMS resonator 1004A made of silicon of receiver 1000 according to Embodiment 9 rises from 25° C. to 65° C. In FIG. 25, profile 1902A indicates the frequency of the baseband signal when both of frequency adjusters 1006 and 1010 do not operate, and profile 1902B indicates the frequency of the baseband signal when both of frequency adjusters 1006 and 1010 operate. Since frequency adjuster 1902 can adjust frequency fL1 within a sufficiently wide range, the frequency of the baseband signal of profile 1902B becomes 0 Hz on profile 1902B even when the temperature reaches 65° C. at time t1 and the frequency of the baseband signal of profile 1902A is −856 kHz. Since frequency adjuster 1006 can adjust frequency fL1 only by a unit of 2.14 kHz, an adjustment ripple as a fluctuation of a width 2.14 kHz occurs every time when frequency fL1 is adjusted even if synthesizer unit 1003 is controlled sufficiently fast to the temperature change. As described above, the adjustment ripple may provide an adverse effect to demodulator 1011, and may deteriorate the receiving quality.

The adjustment ripple occurs due to the fact that frequency adjusters 1006 and 1010 operate independently to each other. Frequency adjuster 1010 detects the frequency difference with using the reference symbol included in the received signal or characteristics in a signal format, and have an advantage that the adjustment resolution can be sufficiently small. In receiver 1000 according to Embodiment 9, the adjustment resolution is suppressed finer than 10 Hz and the adjustment ripple is not larger than the adjustment resolution, hence preventing the adjustment ripple from occurring, as shown in FIG. 22. On the other hand, frequency adjuster 1010 has a disadvantage that the adjustment width, such as ±700 kHz, of frequency fL1 is narrow. Since frequency adjuster 1006 calculates the frequency difference based on the temperature detected by temperature sensor 1005, there is an advantage that the adjustment width of frequency fL1 can be made sufficiently large. On the other hand, the adjustment resolution of frequency adjuster 1006 is large due to the resolution of the temperature sensor, and, as shown in FIG. 25, has a disadvantage that the adjustment ripple of 2.14 kHz occurs. These characteristics are the same as the case in the mobile receivers and wireless LAN devices, in addition to the receivers for the digital broadcasting.

Therefore, noting that the advantages and the disadvantages of two frequency adjusters 1006 (1902) and 1010 are contradicting to each other, controller 1903 reduces the adverse effect given to demodulator 1011 by interconnecting operations of two frequency adjusters 1006 (1902) and 1010.

Specifically, when the amount the adjustment of frequency fL2 by frequency adjuster 1010 is not larger than a predetermined threshold, controller 1903 does not activate frequency adjuster 1902 and activates only frequency adjuster 1010 to operate. When the amount for adjustment of the frequency fL2 by frequency adjuster 1010 exceeds the predetermined threshold, controller 1903 activates frequency adjuster 1902 to operate. An operation of controller 1903 will be described below. Threshold memory 1904 previously stores a threshold of 700 kHz which is the adjustment range of frequency adjuster 1010. Comparator 1905 compares the amount of adjustment of the frequency by frequency adjuster 1010 to the threshold stored in threshold memory 1904. Comparator 1905 does not output enable signal SEN and does not activate frequency adjuster 1902 when an absolute value of the amount of adjustment of the frequency by frequency adjuster 1010 is smaller than the threshold. On the other hand, when the absolute value of the amount for adjustment of the frequency by frequency adjuster 1010 is larger than the threshold, comparator 1905 outputs enable signal SEN to activate frequency adjuster 1902 to operate so as to adjust frequency fL1 of local oscillation signal SL1 based on the temperature detected by temperature sensor 1005. This operation removes the frequency difference between local oscillation signal SL1 and intermediate frequency signal SIF. As a result, the amount of adjustment of the frequency by frequency adjuster 1010 is gradually converged to 0 Hz, and frequency adjuster 1010 adjusts frequency fL2 within the range of ±700 kHz. This operation causes the absolute value of the amount of the adjustment of the frequency by frequency adjuster 1010 to be not more than the threshold stored in threshold memory 1904, and prevent comparator 1905 from outputting enable signal SEN. Since frequency adjuster 1902 does not operate until another deviation of 700 kHz is generated in frequency fL1 of local oscillation signal SL1, the adjustment ripple due to the operation of frequency adjuster 1902 is suppressed sufficiently.

Figure 26:
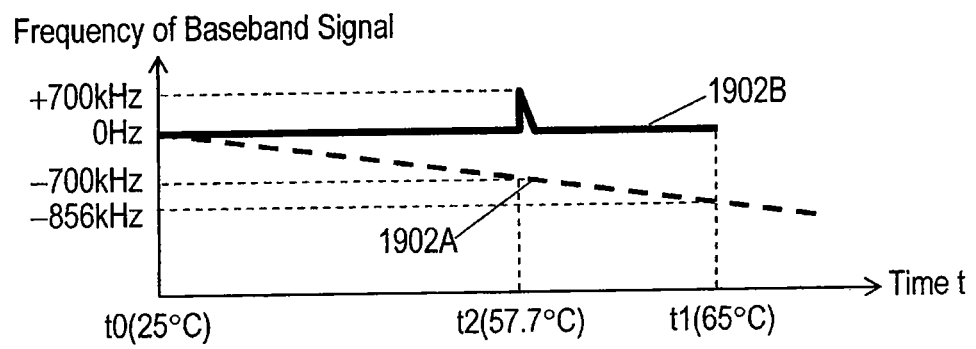
FIG. 26 shows a fluctuation of a frequency of a baseband signal of the receiver according to Embodiment 10.

FIG. 26 shows a fluctuation of the frequency of the baseband signal of receiver 1901 according to Embodiment 10. In FIG. 26, profile 1901A indicates the fluctuation of the frequency of the baseband signal with both of frequency adjusters 1010 and 1902 deactivated not operating. Profile 1901B indicates the fluctuation of the frequency of the baseband signal when controller 1903 controls frequency adjuster 1010 and 1902 in the above described manner. Since threshold memory 1904 records the threshold of 700 kHz, comparator 1905 does not output enable signal SEN until the amount for adjustment of the frequency by frequency adjuster 1010 becomes −700 kHz. Accordingly, since frequency adjuster 1902 does not operate and only frequency adjuster 1010 operates, the adjustment ripple hardly occurs similarly to FIG. 23. At a time point when the amount for adjustment of the frequency by frequency adjuster 1010 exceeds −700 kHz, comparator 1905 outputs enable signal SEN. Enable signal SEN activates frequency adjuster 1902 to adjust frequency fL1 of local oscillation signal SL1 based on the temperature detected by temperature sensor 1005. This operation removes the frequency difference of frequency fL1 of local oscillation signal SL1 and intermediate frequency signal SIF. On the other hand, since the amount of adjustment by frequency adjuster 1010 at this point is −700 kHz, the frequency of the baseband signal becomes +700 kHz. However, since frequency adjuster 1010 causes the baseband signal to converge to 0 Hz following at several hundred milliseconds, an effect that is given to demodulator 1011 is at most several hundred milliseconds. Subsequently, controller 1903 does not activate frequency adjuster 1902 until the absolute value of the amount of adjustment of the frequency by frequency adjuster 1010 exceeds 700 kHz, and activates only frequency adjuster 1010, thereby suppressing the adjustment ripple due to the operation of frequency adjuster 1902.

As described above, receiver 1901 according to Embodiment 10 stably adjusts the frequency of the baseband signal utilizing the advantage of fine adjustment resolution of frequency adjuster 1010, and compensates the disadvantage of the narrow adjustment range by frequency adjuster 1902. Further, by decreasing a frequency of the operation of frequency adjuster 1902, it is possible to suppress the disadvantage of the adjustment ripple due to frequency adjuster 1902.

Threshold memory 1904 can store the rate of the amount to time of the adjustment of the frequency as a threshold. In this case, controller 1903 allows comparator 1905 to output enable signal SEN when an absolute value of the rate of the amount to time of adjustment of the frequency by frequency adjuster 1010 exceeds the threshold. Frequency adjuster 1010 has a predetermined speed at which the frequency is adjusted. The speed is 1.6 kHz/second for receiver 1901 according to Embodiment 9. If the difference of frequency fL1 of local oscillation signal SL1 is generated above this speed, the frequency of the baseband signal fluctuates even if the fluctuation is within the adjustment range of frequency adjuster 1010, hence deteriorating the receiving quality. Comparator 1905 outputs enable signal SEN based on the rate of the amount to time of frequency to be adjusted to activate frequency adjuster 1902 to operate, thereby suppressing deterioration of the receiving quality even when the rate of change to time of the temperature of MEMS resonator 1004A is large.

Figure 27:
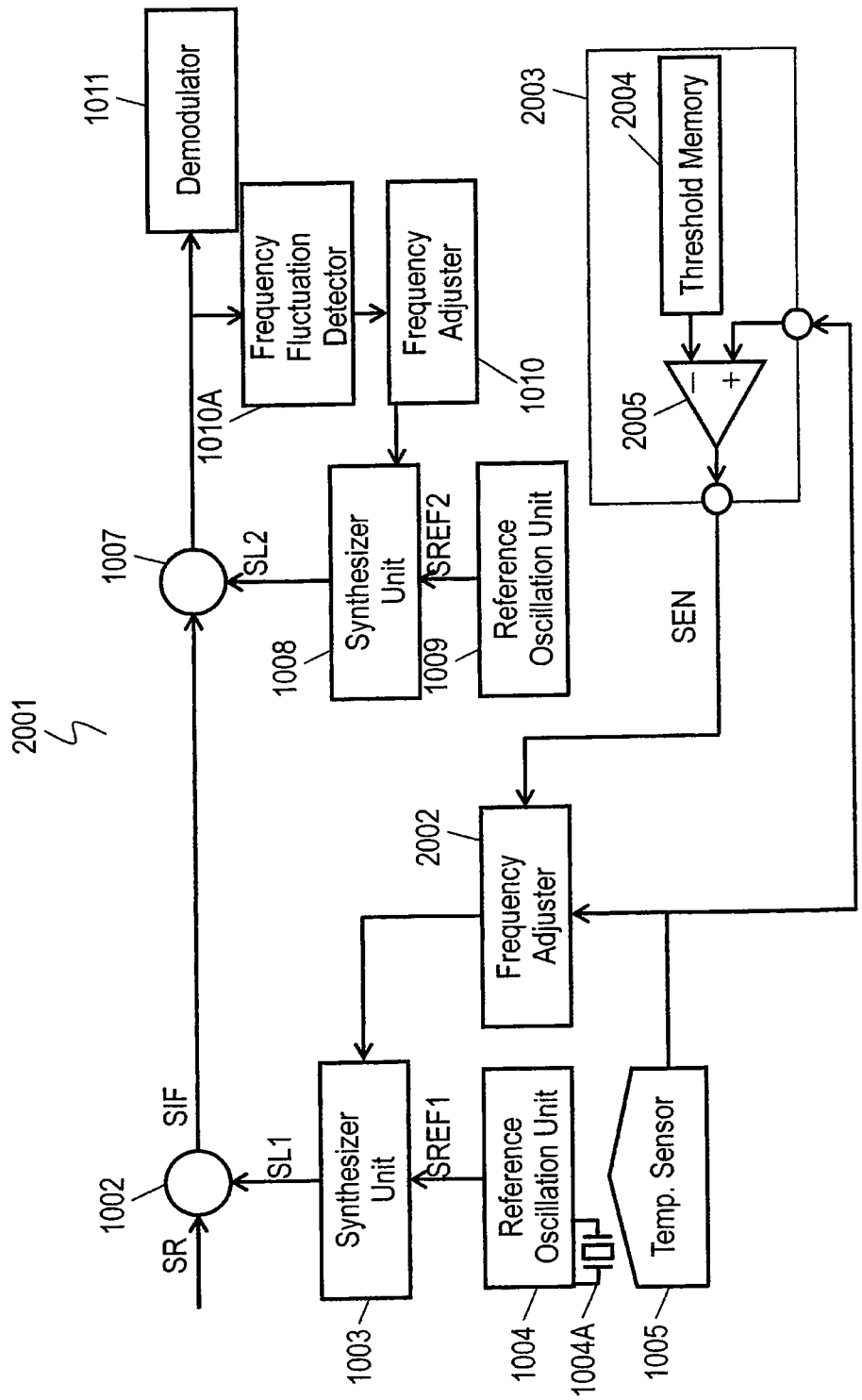
FIG. 27 is a block diagram of another receiver according to Embodiment 10.

FIG. 27 is a block diagram of another receiver 2001 according to Embodiment 10. In FIG. 27, components identical to those of receiver 1901 shown in FIG. 24 are denoted by the same reference numerals, and their description will be omitted. Receiver 2001 includes controller 2003 instead of controller 1903 of the receiver shown in FIG. 24. Controller 2003 outputs enable signal SEN to frequency adjuster 2002 based on the temperature detected by temperature sensor 1005. Controller 2003 includes threshold memory 2004 that stores a threshold of a temperature, and comparator 2005 that compares the temperature detected by temperature sensor 1005 to the threshold and outputs enable signal SEN.

Controller 2003 activates frequency adjuster 2002 to operate only when an absolute value of the detected temperature exceeds the threshold. With this configuration, even when frequency adjuster 1010 cannot detect the fluctuation of frequency fL2 in a period, such as no receiving is executed, frequency adjuster 1010 can adjust frequency fL1 of local oscillation signal SL1. Controller 2003 can control the operation of frequency adjuster 2002 based on the rate of change to time of the detected temperature. This operation allows frequency adjuster 2002 to operate when the temperature changes at a speed exceeding the speed that frequency adjuster 1010 can adjust.

Controllers 1903 and 2003 can be implemented by circuits or software. Controllers 1903 and 2003 can be accommodated in demodulator 1011, or in the display that is connected to a subsequent stage of demodulator 1011. According to Embodiment 10, the range of frequency to be adjusted by frequency adjuster 1010 is ±700 kHz. However, practically, the range is often limited to an order of ±100 kHz in order to reduce sizes of the memory for comparison to the reference symbols included in frequency adjuster 1010. In this case, the threshold stored in threshold memory 1904 is set to 100 kHz. In order to secure margin more, the threshold can be set to a value, such as 50 kHz, which is smaller than the frequency range that can be adjusted by frequency adjuster 1010. While temperature coefficient α of MEMS resonator 1004A made of silicon is −30 ppm/° C. in this description, temperature coefficient α may be improved up to about −22 ppm/° C. by forming resonator 1004A with polycrystal silicon. Temperature coefficient α can be further improved up to the order of several ppm/° C. by combining silicon with $SiO_2$ having frequency a temperature characteristic opposite to that of silicon. As described above, if temperature coefficient α of resonator 1004A is improved, the threshold of the temperature stored in threshold memory 2004 can be increased.

Exemplary Embodiment 11

Figure 28:
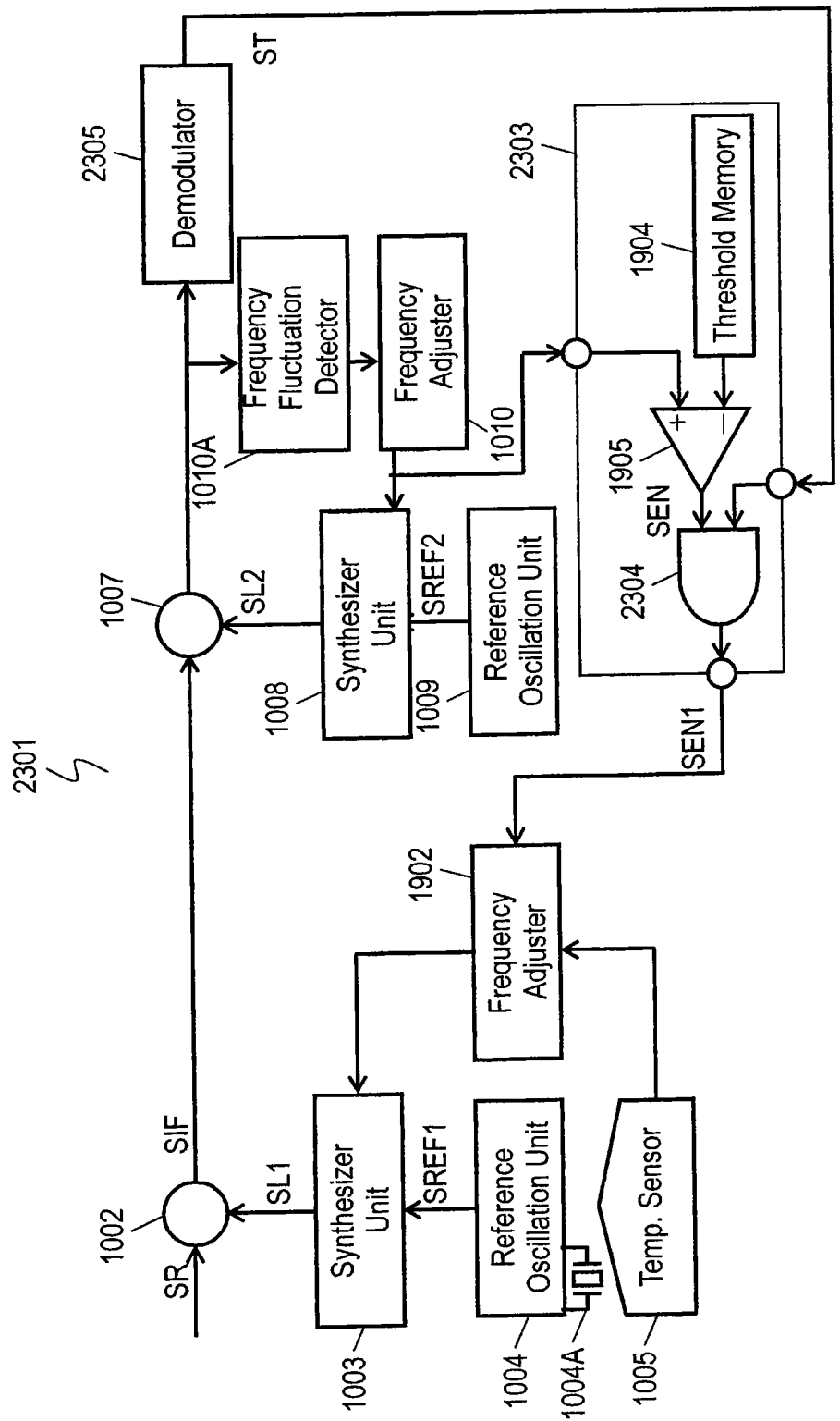
FIG. 28 is a block diagram of a receiver according to Exemplary Embodiment 11.

FIG. 28 is a block diagram of receiver 2301 according to Exemplary Embodiment 11. In FIG. 28, components identical to those of receiver 1901 shown in FIG. 24 are denoted by the same reference numerals, and their description will be omitted. Receiver 2001 includes controller 2303 instead of controller 1903 of receiver 1901 shown in FIG. 24.

Controller 2303 controls an operation of frequency adjuster 1902 based on timing signal ST output from demodulator 2305. Demodulator 2305 detects a period in which an influence of the frequency fluctuation to demodulation is small, and outputs timing signal ST during this period. This operation avoids deterioration of the receiving quality sue to a temporal deviation of the frequency due to the operation of frequency adjuster 1902 shown in FIG. 26.

While the deviation of the frequency normally gives an adverse effect to the demodulation process executed by demodulator 2305, the deviation does not always give a large influence to the demodulation process over an entire time period depending on the method of transmitting and receiving. For example, in the time division multiple access (TDMA) system, an influence to the demodulation process is small even if the frequency fluctuation is generated other than during communication time assigned to one's terminal. In the receiver for the digital broadcasting, during the guard interval of the OFDM signal, an influence of the frequency fluctuation given to the demodulation process is small as compared to the effective symbol period. Moreover, as the demodulation process is suspended during a period of channel selection, the fluctuation of the frequency is tolerated. Demodulator 2305 outputs timing signal ST in such a period. During the period in which timing signal ST is output, controller 2303 outputs enable signal SEN1 based on the amount of adjustment of the frequency by frequency adjuster 1010. Specifically, signal SEN output from comparator 1905 and timing signal ST demodulator 2305 are input to AND circuit 2304. AND circuit 2304 outputs enable signal SEN1 only during a period in which both of signals SEN and ST are effective. When controller 2303 does not output enable signal SEN1, frequency adjuster 1902 does not operate. When controller 2303 outputs enable signal SEN1, frequency adjuster 1902 operates and adjusts frequency fL1. The period during which enable signal SEN1 is output corresponds to a period in which the influence of the fluctuation of the frequency given to the demodulation process is small. Therefore, controller 2303 can adjust frequency fL1 by allowing frequency adjuster 1902 to operate without affecting the demodulation process.

Exemplary Embodiment 12

Figure 29:
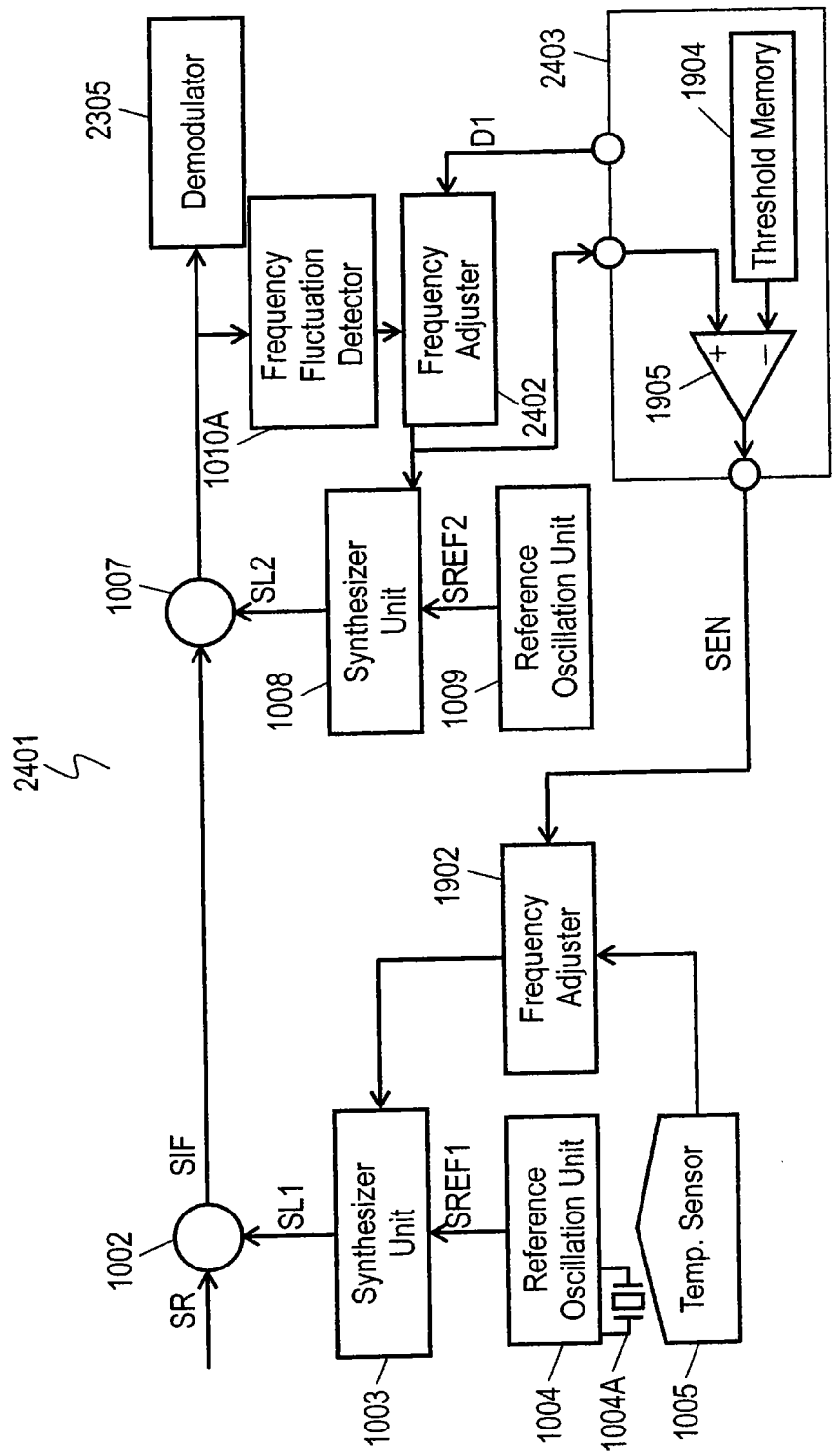
FIG. 29 is a block diagram of a receiver according to Exemplary Embodiment 12.
Figure 30:
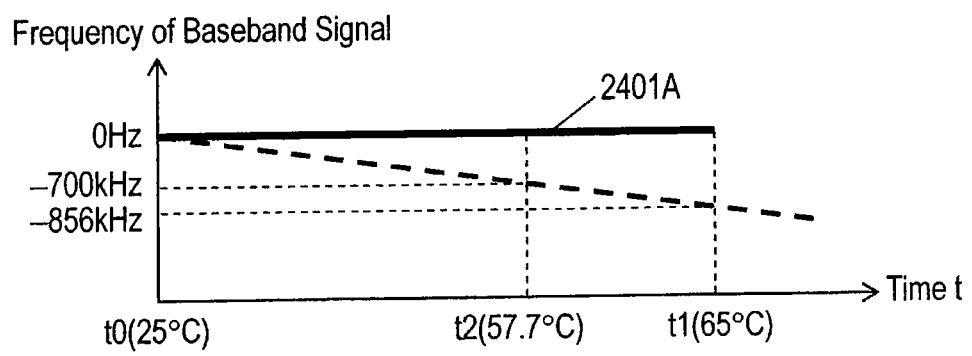
FIG. 30 shows a frequency of a baseband signal of the receiver according to Embodiment 12.

FIG. 29 is a block diagram of receiver 2401 according to Exemplary Embodiment 12. In FIG. 29, components identical to those of receiver 1901 shown in FIG. 24 are denoted by the reference numerals, and their description will be omitted. Receiver 2401 includes controller 2403 and frequency adjuster 2402 instead of controller 1903 and frequency adjuster 1010 of receiver 1901 shown in FIG. 24. Controller 2403 is connected to frequency adjuster 2402. Controller 2403 outputs enable signal SEN to activate frequency adjuster 1902 to operate, and outputs a predetermined value D1 to frequency adjuster 2402 while frequency adjuster 1902 operates. Frequency adjuster 2402 adjusts frequency fL2 of local oscillation signal SL2 based on predetermined value D1. Typically, when frequency adjuster 1902 operates, controller 2403 sets predetermined value D1 be transmitted to frequency adjuster 2402 to 0 Hz. When the frequency of frequency fL1 or received signal SR output from synthesizer unit 1003 has a predetermined offset, controller 2403 sets predetermined value D1 to the offset. This operation reduces an influence of a temporal deviation of the frequency due to the operation of frequency adjuster 1902 shown in FIG. 26. FIG. 30 shows a frequency of a baseband signal of receiver 2401. In FIG. 30, controller 2403 sets predetermined value D1 be transmitted to frequency adjuster 2402 to 0 Hz when comparator 1905 outputs enable signal SEN. In this case, frequency adjuster 1902 removes the fluctuation of frequency fL1 of local oscillation signal SL1, and the amount of adjustment of the frequency by frequency adjuster 2402 becomes 0 Hz at this moment. Consequently, the temporal deviation of the frequency shown by profile 2401A due to the operation of frequency adjuster 1902 is not generated. Although it is required practically to match a timing at which the fluctuation of frequency fL1 of local oscillation signal SL1 is removed by the operation of frequency adjuster 1902 with a timing at which frequency adjuster 2402 adjusts the frequency based on predetermined value D1, it is possible to reduce an adverse effect to demodulator 2305 by the operation of frequency adjuster 1902.

Exemplary Embodiment 13

Figure 31:
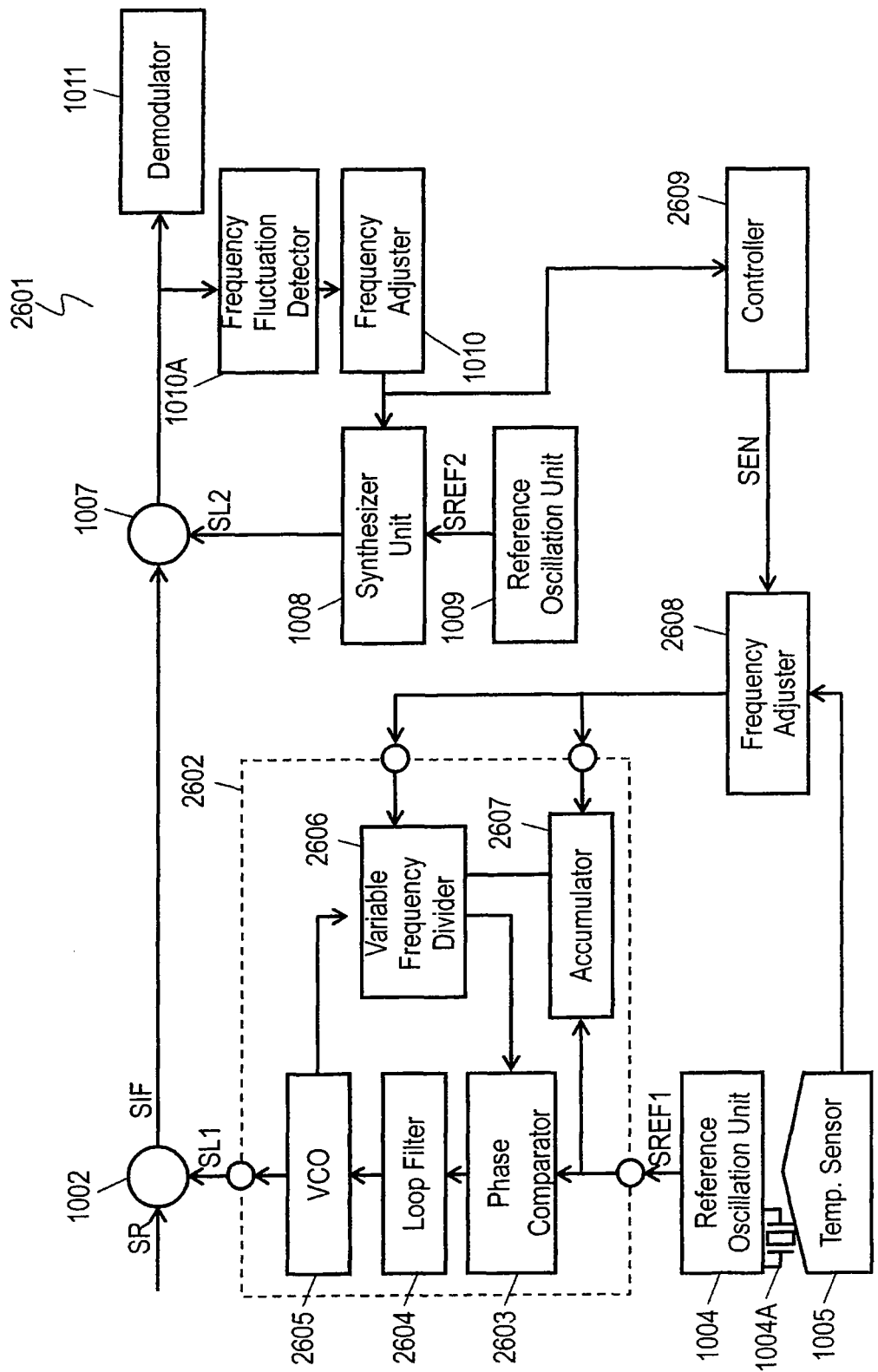
FIG. 31 is a block diagram of a receiver according to Exemplary Embodiment 13.

FIG. 31 is a block diagram of receiver 2601 according to Exemplary Embodiment 13. In FIG. 31, components identical to those of receiver 1901 shown in FIG. 24 are denoted by the same reference numerals, and their description will be omitted. Receiver 2601 includes controller 2609, frequency adjuster 2508, and synthesizer unit 2602 instead of controller 1903, frequency adjuster 1902, and synthesizer unit 1003 of receiver 1901 shown in FIG. 24. Synthesizer unit 2602 includes phase comparator 2603 that outputs a signal having a pulse width proportional to a phase difference between reference oscillation signal SREF1 and the comparison signal, loop filter 2604 that outputs a signal of a low-frequency component of the signal output from phase comparator 2603, voltage-controlled oscillator (VCO) 2605 that generates local oscillation signal SL1, accumulator 2607 that outputs an overflow signal based on reference oscillation signal SREF1 and a set value from frequency adjuster 2608, and variable frequency divider 2606 that frequency-divides the signal output from VCO 2605 and outputs a comparison signal, thus constituting a PLL. VCO 2605 determines frequency fL1 of local oscillation signal SL1 based on the signal output from loop filter 2604. Variable frequency divider 2606 divides local oscillation signal SL1 by a dividing ratio determined based on the set value from frequency adjuster 2608 and the overflow signal. Controller 2609 controls an operation of frequency adjuster 2608 based on the signal output from frequency adjuster 1010.

The dividing ratio of variable frequency divider 2606 can be set to a fraction. Accumulator 2607 sets fraction dividing ratio F that is equal to or smaller than maximum value Q from frequency adjuster 2608, and adds fraction dividing ratio F based on reference oscillation signal SREF1. At a time point when the added value exceeds maximum value Q, accumulator 2607 outputs the overflow signal. Variable frequency divider 2606 can set integer dividing ratio M from frequency adjuster 2608, and switches the dividing ratio between M and M+1 every time when the overflow signal from accumulator 2607 is input. As a result, the frequency of the comparison signal that variable frequency divider 2606 outputs to phase comparator 2603 is switched between frequencies obtained by dividing frequency fL1 of signal SL1 output from VCO 2605 by dividing ratios M and M+1. As a long-time average, the dividing ratio can be set to a value between dividing ratios M and M+1. Accordingly, frequency fL1 of local oscillation signal SL1 output from VCO 2605 is expressed by formula 8 using frequency fREF1 of reference oscillation signal SREF1.

$$fL1 = fREF1 \times (M + F/Q) \tag{8}$$

Synthesizer unit 2602 can obtain a very small adjustment resolution without decreasing frequency fREF1 of reference oscillation signal SREF1. For example, when accumulator 2607 has 20 bits, maximum value Q is $2^{20}$. When frequency fREF1 is 10 MHz, the resolution by which frequency adjuster 2608 can adjust is about 9.54 Hz (=10 MHz/220). In practice, it is possible to realize the fraction dividing ratio by an integer frequency divider provided between reference oscillation unit 1004 and synthesizer unit 2602. It is also possible to realize the fraction dividing ratio by a prescaler provided between VCO 2605 and variable frequency divider 2606.

Synthesizer unit 2602 can eliminate the ripples generated due to the operation of frequency adjuster 2608, and suppresses the frequence that the deviation in adjustment occurs. As described above, frequency adjuster 2608 can prevent the frequency of local oscillation signal SL2 from exceeding the range of adjustment by frequency adjuster 1010. However, since the resolution of the temperature that can be detected by temperature sensor 1005 is at least 0.1° C., frequency adjuster 2608 causes an adjustment ripple by 2.14 kHz unit, deteriorating receiving quality. However, when the temperature change of 0.1° C. is detected, frequency adjuster 2608 does not adjust frequency fL1 by 2.14 kHz at once, but adjusts frequency fL1 by an amount of a tolerable frequency fluctuation that does not affect the demodulation process of demodulator 1011, hence adjusting frequency fL1 without deteriorating the receiving quality. Here, the amount of the tolerable frequency fluctuation is mainly determined by a Doppler tolerance of the receiver. In general, since mobile receivers, such as mobile telephones and portable televisions, receives signal SR while moving, the level of received signal SR fluctuates by time. The time fluctuation correlates with a Doppler frequency determined from a moving speed and the frequency of received signal SR. A maximum Doppler frequency at which the receiver can correctly receive the signal is referred to as the Doppler tolerance. For example, when the Doppler tolerance is 100 Hz, the receiving is possible even if the frequency of received signal SR fluctuates by 100 Hz. This means that the receiving is possible at a moving speed corresponding to a Doppler frequency of 100 Hz. The Doppler tolerance of the receiver is mainly determined by a transmission path estimation method of demodulator 1011.

Here, for demodulator 1011, the fluctuation of the frequency of received signal SR is equivalent to the fluctuation of frequency fL1 of local oscillation signal SL1. Specifically, frequency converter 1002 outputs signal SIF having a frequency of a difference between received signal SR and frequency fL1 of local oscillation signal SL1. Accordingly, similarly to the fluctuation due to the Doppler frequency of received signal SR, the fluctuation of frequency fL1 of local oscillation signal SL1 also causes the fluctuation of the frequency of the baseband signal input to demodulator 1011. Therefore, when the Doppler tolerance of demodulator 1011 is 100 Hz, receiver 2601 can receive signal SR if the fluctuation of frequency fL1 of local oscillation signal SL1 is within 100 Hz.

As described above, the amount of the tolerable frequency fluctuation of demodulator 1011 is mainly determined by the Doppler tolerance. Frequency adjuster 2608 can eliminate the adjustment ripples by controlling the dividing ratio by a unit smaller than this amount of the tolerable frequency fluctuation. Here, in order to control the dividing ratio by a unit smaller than the amount of tolerable frequency fluctuation, synthesizer unit 2602 uses a PLL that can execute a fraction dividing ratio. Synthesizer unit 2602 can adjust frequency fL1 by a unit of about 9.54 Hz using accumulator 2607 of 20 bits. Accordingly, when the amount of the tolerable frequency fluctuation of demodulator 1011 is 100 Hz, frequency adjuster 2608 can change frequency fL1 of local oscillation signal SL1 by a width of about 95.4 Hz by setting so as to increment or decrement fraction dividing ratio F by 10. Since this width is smaller than the amount of the tolerable frequency fluctuation of demodulator 1011, demodulator 1011 can demodulates the baseband signal.

A method for controller 2609 to suppress the frequence that the deviation of adjustment is caused due to the operation of frequency adjuster 2608 will be described below. Frequency adjuster 1010 outputs the amount for adjustment of the frequency based on the baseband signal. Controller 2609 outputs enable signal SEN to frequency adjuster 2608 when this amount exceeds a threshold. Further, when enable signal SEN is output, frequency adjuster 2608 sets fraction dividing ratio F and integer dividing ratio M of synthesizer unit 2602 based on the temperature detected by temperature sensor 1005. At this moment, controller 2609 can output a predetermined value to frequency adjuster 1010. On the other hand, when controller 2609 does not output enable signal SEN, frequency adjuster 2608 sets fraction dividing ratio F of synthesizer unit 2602 by a unit smaller than the amount of the tolerable frequency fluctuation of demodulator 1011 based on the temperature detected by temperature sensor 1005. Specifically, when the temperature increases 0.1° C., frequency fL1 of local oscillation signal SL1 is required to be smaller by about 2.14 kHz. By incrementing fraction dividing ratio F by 10, frequency fL1 of local oscillation signal SL1 is reduced by about 95.4 Hz. Accordingly, frequency adjuster 2608 can decrease frequency fL1 of local oscillation signal SL1 by 2.14 kHz by setting the number of frequency dividing ratio for 23 times (2.14 kHz/95.4 Hz) at a predetermined cycle, while demodulator 1011 continues the demodulation process. For example, when a set period of the dividing ratio is 10 milliseconds, the fluctuation of frequency fREF1 of reference oscillation signal SREF1 due to the temperature change of 0.1° C. can be adjusted in 230 milliseconds. The adjustment speed in this case is 0.43° C./second. As shown in FIG. 26, frequency adjuster 2608 operates and the deviation of adjustment occurs in the baseband signal when the amount of adjustment of the frequency by frequency adjuster 1010 exceeds −700 kHz. In receiver 2601 of Embodiment 13, frequency adjuster 2608 adjusts frequency fL1 of local oscillation signal SL1 by the unit smaller than the amount of the tolerable frequency fluctuation even when controller 2609 does not output enable signal SEN. Accordingly, when the rate of the temperature change is not higher than 0.43° C./second, the fluctuation of frequency fL2 of local oscillation signal SL2 does not exceed the adjustment range of frequency adjuster 1010. As described above, when the rate of the temperature change is not higher than the predetermined value, frequency adjusters 1010 and 2608 operate simultaneously to adjust the frequency by the amount not larger than the tolerable frequency fluctuation so as to prevent the deviation of adjustment in the baseband signal due to large adjustment to the dividing ratio.

Exemplary Embodiment 14

Figure 32:
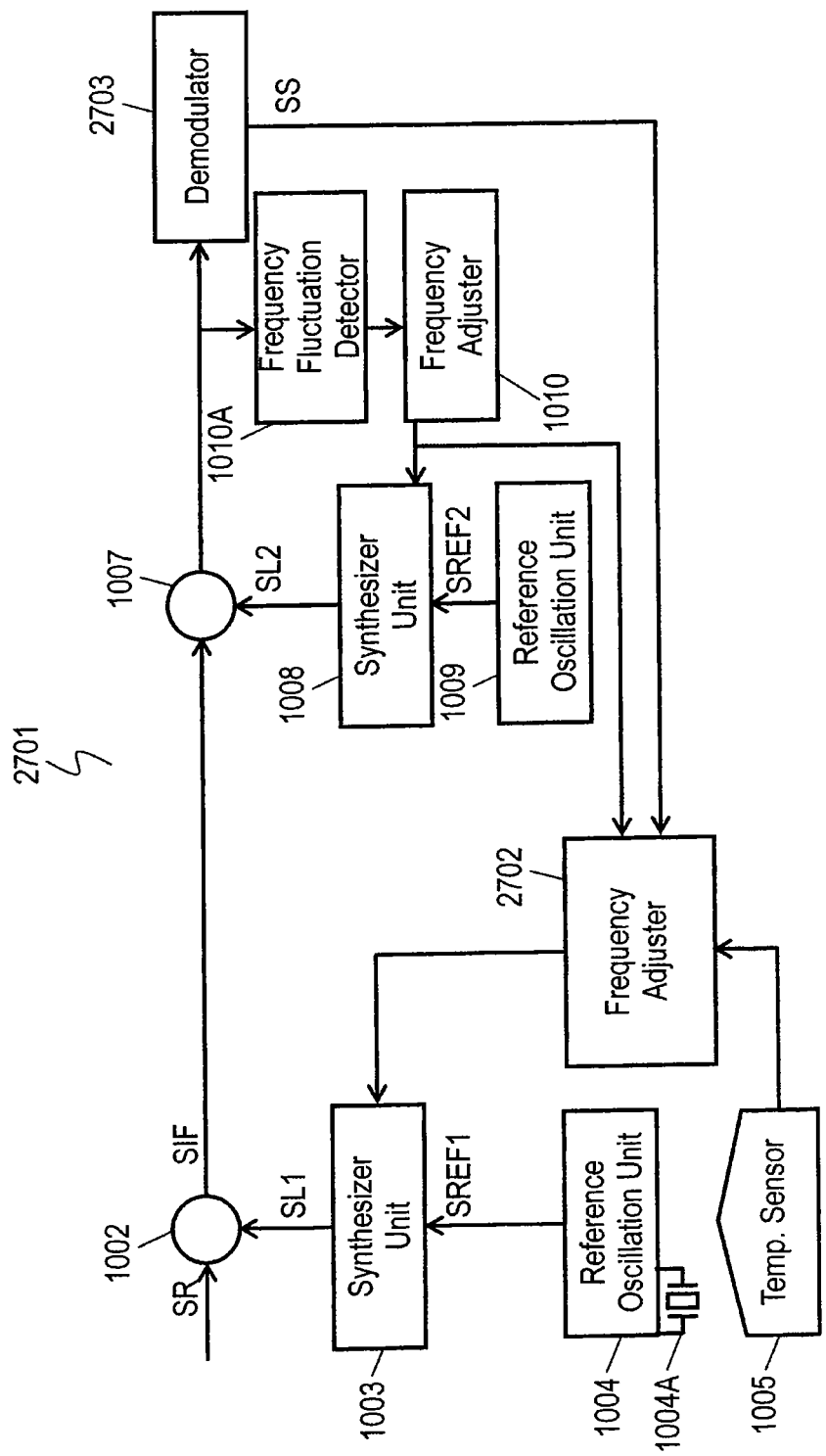
FIG. 32 is a block diagram of a receiver according to Exemplary Embodiment 15.

FIG. 32 is a block diagram of receiver 2701 according to Exemplary Embodiment 14. In FIG. 32, components identical to those of receiver 1000 according to Embodiment 9 shown in FIG. 17 are denoted by the same reference numerals, and their description will be omitted. Receiver 2701 includes frequency adjuster 2702 and demodulator 2703 instead of frequency adjuster 1006 and demodulator 1011 of receiver 1000 shown in FIG. 17. Demodulator 2703 outputs synchronization detection signal SS. The synchronization detection signal SS and an amount of adjustment of a frequency by frequency adjuster 1010 is input to frequency adjuster 2702.

After synchronizing the frequency based on the baseband signal, demodulator 2703 demodulates the baseband signal. Demodulator 2703 outputs synchronization detection signal SS in a period during which the frequency is synchronized, and does not output synchronization detection signal SS in a period during which the frequency is not synchronized. Frequency adjuster 2702 adjusts frequency fL1 of local oscillation signal SL1 based on the amount of adjustment of the frequency by frequency adjuster 1010 in a period during which synchronization detection signal SS is input, and adjusts frequency fL1 of local oscillation signal SL1 based on the temperature detected by temperature sensor 1005 in a period during which synchronization detection signal SS is not input. This operation allows receiver 2701 to have a high adjustment resolution in the period during which the frequency is synchronized, and adjust frequencies fL1 and fL2 based on the temperature detected by temperature sensor 1005 in the period during which the frequency is not synchronized.

As described above, frequency fL2 can be adjusted based only on frequency adjuster 1010 having a resolution of the difference of frequency fL2 is small in the period during which the frequency is synchronized.

Instead of demodulator 2703, frequency adjuster 1010 may output the synchronization detection signal.

The receivers according to Embodiments 1 to 14 include MEMS resonator 114 or 1004A as a resonator made of semiconductor material, such as silicon, or a resonator made of polysilicon. MEMS resonators 114 and 1004A may be film bulk acoustic resonators (FBARs) mainly made of piezoelectric thin film material, such as AlN, ZnO, or PZT, or resonators mainly made of other thin film materials, such as $SiO_2$. MEMS resonators 114 and 1004A may be surface acoustic wave (SAW) resonators utilizing surface acoustic waves, or boundary acoustic wave resonators utilizing boundary waves that transmit through a boundary between different materials. These resonators do not have frequency temperature characteristics similar to that of AT-cut crystal resonators, and have first order temperature coefficient α which is not zero. For example, temperature coefficient α of a FBAR resonator made of AlN with a longitudinal thickness vibration vibrating in the same direction as that of an electric field to be applied is −25 ppm/° C. Temperature coefficient α of a resonator made of ZnO is about −60 ppm/° C. Temperature coefficient α of a SAW resonator made of 36 degree Y-cut lithium tantalate as a base material is about −35 ppm/° C. Temperature coefficient α of a SAW resonator made of 64 degree Y-cut lithium niobate is about −72 ppm/° C. These resonators can be smaller than a crystal resonator, and can be used for the synthesizers and the receivers according to Embodiments 1 to 14. These resonators can be integrated with a semiconductor IC. In particular, the MEMS resonator made of silicon can be formed simultaneously to a semiconductor IC since the IC is formed on a silicon substrate. Since the film bulk acoustic material, such as MN or ZnO, i.e., material for FBARs can be oriented and formed on a semiconductor substrate, and the resonator can be formed integrally with an IC. In order to reduce the size, the resonator is preferably configured so as to have a higher resonance frequency when using resonators utilizing SAW and boundary waves and FBARs. In this case, a synthesizer that is not configured as a PLL is often preferred. For example, a frequency divider is connected to a reference oscillation unit including a SAW resonator, and the frequency is adjusted by adjusting this frequency divider. Further, plural capacitors having switches can be connected to the reference oscillation unit including the SAW resonator as a load capacitor, hence adjusting the frequency by discretely switching the load capacitor by activating the switches.

Synthesizer units 101 and 2602 are configured by PLLs, but may be implemented by delay locked loops (DLLs). Further, synthesizer units 101 and 2602 may be synthesizers, such as a direct digital synthesizer (DDS), that do not configure a loop. The DDS constituting synthesizer 101 or 2602 may include, for example, a memory that previously stored a signal, and a digital/analog (D/A) converter that converts the signal into an analog signal. Further, the frequency may be adjusted by a frequency divider directly connected to reference oscillation unit 102. Moreover, the frequency may be adjusted by adjusting a load impedance of the reference oscillation unit. Plural capacitors having switches can be connected to the reference oscillation unit as the load impedance of the reference oscillation unit. In this case, the frequency can be adjusted by discretely switching the load impedance by activating the switches.

The synthesizer according to Embodiments 1 to 14 can change the frequency largely, and can be used for channel switching in addition to the frequency temperature compensation. In this case, the integer dividing ratio is changed simultaneously. The integer dividing ratio may be switched in addition to the fraction dividing ratio also in the case of the frequency temperature compensation.

Although the receiver of the ISDB-T standard has been described, the broadcasting method is not limited to this. For example, as the television system, a system such as the DVB-T standard employed in Europe and the like or the DVB-H standard may be employed. These systems employ the OFDM as in the ISDB-T, and a minimum carrier interval in these systems is 1 kHz. Further, it is possible to obtain the same effects by applying the receiver according to Embodiments 1 to 14 to such as a mobile telephone system. For example, in setting of the frequency difference conditions, instead of the frequency difference condition of image reception, a frequency difference condition focusing reception quality during a call and an error free frequency difference condition with which an error free state can be established during data reception can be conceived, and predetermined frequency adjustment resolutions corresponding to these conditions are set.

Memory 117 that stores data for compensating the frequency may be located outside the synthesizer. The data may be the dividing ratio itself corresponding to the temperature, or the dividing ratio may be calculated externally based on the data.

INDUSTRIAL APPLICABILITY

A synthesizer according to the present invention can output a signal having a stable frequency even when a resonator has a large fluctuation in an oscillation frequency to temperatures. This synthesizer is useful for a small-sized receiver, such as telephone terminals and broadcasting receivers, having a low cost.

The invention claimed is:

1. A synthesizer comprising:
   a synthesizer unit for generating a local oscillation signal based on a reference oscillation signal output from a reference oscillation unit including a resonator;
   a frequency fluctuation detector by detecting a frequency fluctuation of the reference oscillation unit; and
   a frequency adjuster for adjusting a frequency of the local oscillation signal based on the frequency fluctuation detected by the frequency fluctuation detector,
   wherein the synthesizer is adapted to be used for a receiver that receives a signal, and the frequency fluctuation detector detects the frequency fluctuation of the reference oscillation unit based on a difference between the frequency of the local oscillation signal and a frequency of the received signal,
   the received signal contains a plurality of carriers, and
   a frequency resolution of detecting of the frequency fluctuation detector is smaller than an interval between the plurality of carriers.

2. The synthesizer according to claim 1, wherein a first order temperature coefficient of the reference oscillation unit is not smaller than 1.2 ppm/° C.

3. A receiver comprising:
   a first synthesizer unit for generating a first local oscillation signal based on a reference oscillation signal output from a reference oscillation unit including a resonator;
   a first frequency converter for heterodyning a received signal based on the first local oscillation signal;
   a frequency fluctuation detector by detecting a frequency fluctuation of the reference oscillation unit based on a signal output from the first frequency converter and the received signal; and
   a first frequency adjuster for adjusting a frequency of the first local oscillation signal based on the frequency fluctuation detected by the frequency fluctuation detector,
   wherein the frequency fluctuation detector detects the frequency fluctuation of the reference oscillation unit based on a difference between the frequency of the local oscillation signal and a frequency of the received signal,
   the received signal contains a plurality of carriers, and
   a frequency resolution of detecting of the frequency fluctuation detector is smaller than an interval between the plurality of carriers.

4. The receiver according to claim 3, further comprising:
   a second synthesizer unit for generating a second local oscillation signal; and
   a second frequency converter for heterodyning the signal output from the first frequency converter based on the second local oscillation signal, wherein
   the frequency fluctuation detector detects the frequency fluctuation of the reference oscillation unit based on a signal output from the second frequency converter.

5. The receiver according to claim 4, further comprising a second frequency adjuster for adjusting a frequency of the second local oscillation signal based on the frequency fluctuation detected by the frequency fluctuation detector.

6. The receiver according to claim 3, further comprising a temperature sensor for detecting a temperature, wherein the first frequency adjuster adjusts the frequency of the first local oscillation signal based on at least one of a result of the detection of the temperature sensor and the frequency fluctuation detected by the frequency fluctuation detector.

7. The receiver according to claim 3, wherein
   the received signal contains a reference symbol, and
   the frequency fluctuation detector detects the frequency fluctuation based on the reference symbol.

8. The receiver according to claim 3, wherein the MEMS resonator is formed on a semiconductor substrate that is different from a substrate on which the first synthesizer unit is formed.

* * * * *